US012635523B2

(12) United States Patent
Heo

(10) Patent No.: US 12,635,523 B2
(45) Date of Patent: May 19, 2026

(54) SEMICONDUCTOR PACKAGE AND METHOD OF MANUFACTURING THE SEMICONDUCTOR PACKAGE

(71) Applicant: SAMSUNG ELECTRONICS CO., LTD., Suwon-si (KR)

(72) Inventor: Daewoong Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 382 days.

(21) Appl. No.: 18/202,735

(22) Filed: May 26, 2023

(65) Prior Publication Data

US 2024/0087983 A1 Mar. 14, 2024

(30) Foreign Application Priority Data

Sep. 13, 2022 (KR) ........................ 10-2022-0114724

(51) Int. Cl.
*H01L 23/02* (2006.01)
*H01L 21/48* (2006.01)
(Continued)

(52) U.S. Cl.
CPC .......... *H01L 23/42* (2013.01); *H01L 21/4857* (2013.01); *H01L 21/56* (2013.01);
(Continued)

(58) Field of Classification Search
CPC ..... H01L 23/42; H01L 21/4857; H01L 21/56; H01L 23/3128; H01L 23/49811;
(Continued)

(56) References Cited

U.S. PATENT DOCUMENTS

| | | | |
|---|---|---|---|
| 7,115,444 | B2 | 10/2006 | Yoshimura |
| 7,199,467 | B2 | 4/2007 | Yoshimura |
(Continued)

FOREIGN PATENT DOCUMENTS

| | | |
|---|---|---|
| KR | 10-2004-0075714 A | 8/2004 |
| KR | 10-2006-0022763 A | 3/2006 |
(Continued)

OTHER PUBLICATIONS

Office Action issued Feb. 10, 2026 by the Korean Ministry of Intellectual Property for KR Patent Application No. 10-2022-0114724.

*Primary Examiner* — Theresa T Doan
(74) *Attorney, Agent, or Firm* — Sughrue Mion, PLLC

(57) ABSTRACT

There is provided a method of manufacturing a semiconductor package, a first redistribution wiring layer including a chip mounting region and a peripheral region surrounding the chip mounting region is formed, and the first redistribution wiring layer has first redistribution wires stacked in at least two layers. A first semiconductor device is mounted on the chip mounting region on the first redistribution wiring layer. A sealing member is formed on the first redistribution wiring layer to cover the first semiconductor device. A plurality of conductive connectors is formed on the peripheral region, and the conductive connectors penetrate the sealing member and are electrically connected to the first redistribution wires. A plurality of through openings extending from an upper surface of the sealing member is formed on the chip mounting region and exposes an upper surface of the first semiconductor device. The through openings are filled up with a conductive material to form a plurality of heat transfer plugs.

19 Claims, 22 Drawing Sheets

(51) Int. Cl.

| | |
|---|---|
| *H01L 21/56* | (2006.01) |
| *H01L 23/31* | (2006.01) |
| *H01L 23/42* | (2006.01) |
| *H01L 23/498* | (2006.01) |
| *H01L 25/10* | (2006.01) |
| *H01L 23/00* | (2006.01) |

(52) U.S. Cl.

CPC .... *H01L 23/3128* (2013.01); *H01L 23/49811* (2013.01); *H01L 23/49822* (2013.01); *H01L 25/105* (2013.01); *H01L 24/16* (2013.01); *H01L 24/17* (2013.01); *H01L 24/32* (2013.01); *H01L 24/73* (2013.01); *H01L 2224/16227* (2013.01); *H01L 2224/17181* (2013.01); *H01L 2224/32225* (2013.01); *H01L 2224/73204* (2013.01); *H01L 2225/1094* (2013.01)

(58) Field of Classification Search

CPC . H01L 23/49822; H01L 25/105; H01L 24/16; H01L 24/17; H01L 24/32; H01L 24/73; H01L 2224/16227; H01L 2224/17181; H01L 2224/32225; H01L 2224/73204; H01L 2225/1094; H01L 21/568; H01L 23/562; H01L 25/50; H01L 2221/68327; H01L 2221/68359; H01L 2225/1023; H01L 2225/1035; H01L 2225/1041; H01L 2225/1058; H01L 23/5386; H01L 23/5385; H01L 23/5389; H01L 21/6835; H01L 23/3677; H01L 2221/68345; H01L 23/49816; H01L 23/3107

USPC .......................................... 257/686; 438/107

See application file for complete search history.

(56) References Cited

U.S. PATENT DOCUMENTS

| | | | | |
|---|---|---|---|---|
| 7,381,592 | B2 | 6/2008 | Yoshimura | |
| 7,723,160 | B2 | 5/2010 | Houle et al. | |
| 8,877,554 | B2 * | 11/2014 | Tsai | H01L 23/49816 |
| | | | | 257/737 |
| 9,496,196 | B2 | 11/2016 | Yu et al. | |
| 10,438,899 | B2 | 10/2019 | Kim et al. | |
| 10,453,822 | B2 | 10/2019 | Kim et al. | |
| 10,825,800 | B2 | 11/2020 | Kim et al. | |
| 11,031,347 | B2 | 6/2021 | Kim et al. | |
| 2006/0019430 | A1 | 1/2006 | Yoshimura | |
| 2010/0213601 | A1 | 8/2010 | Smeys et al. | |
| 2011/0175215 | A1 * | 7/2011 | Farooq | H10D 62/117 |
| | | | | 257/E23.141 |
| 2020/0303249 | A1 | 9/2020 | Kishi | |

FOREIGN PATENT DOCUMENTS

| | | |
|---|---|---|
| KR | 10-2012-0016925 A | 2/2012 |
| KR | 10-1519307 B1 | 5/2015 |
| KR | 10-2019-0016338 A | 2/2019 |
| KR | 10-2019-0065749 A | 6/2019 |
| KR | 10-2020-0134377 A | 12/2020 |

* cited by examiner

SEMICONDUCTOR PACKAGE AND METHOD OF MANUFACTURING THE SEMICONDUCTOR PACKAGE

CROSS-REFERENCE TO RELATED APPLICATION(S)

This application is based on and claims priority under 35 U.S.C. § 119 to Korean Patent Application No. 10-2022-0114724, filed on Sep. 13, 2022, in the Korean Intellectual Property Office (KIPO), the contents of which are herein incorporated by reference in their entirety.

BACKGROUND

1. Field

The disclosure relates to a semiconductor package and a method of manufacturing the semiconductor package. More particularly, the disclosure relates to a semiconductor package including a plurality of stacked semiconductor devices and a method of manufacturing the same.

2. Description of the Related Art

In a fan out wafer level package (FOWLP) manufacturing process, a molding member covering a semiconductor chip may be formed on a semiconductor wafer. Since the molding member has a polymer structure, heat emitted from the semiconductor chip may be blocked by the molding member. When the heat is not emitted from the semiconductor chip, there is a problem in that a warpage phenomenon occurs in the semiconductor chip.

SUMMARY

One or more aspects of the disclosure provide a semiconductor package including a heat transfer plug structure capable of increasing heat transfer performance.

One or more aspects of the disclosure provide a method for manufacturing the semiconductor package.

According to an aspect of the disclosure, there is provided a method of manufacturing a semiconductor package, including: forming a first redistribution wiring layer including a chip mounting region and a peripheral region surrounding the chip mounting region, the first redistribution wiring layer having a plurality of first redistribution wires stacked in at least two layers; mounting a first semiconductor device on the chip mounting region of the first redistribution wiring layer; forming a sealing member on the first redistribution wiring layer, the sealing member provided on an upper surface and a side surface of the first semiconductor device; forming a plurality of conductive connectors on the peripheral region of the first redistribution wiring layer, the plurality of conductive connectors penetrating the sealing member and electrically connected to the plurality of first redistribution wires; forming a plurality of through openings extending from an upper surface of the sealing member towards an upper surface of the first semiconductor device to expose the upper surface of the first semiconductor device; and forming a plurality of heat transfer plugs by filling the through openings with a conductive material.

The method may further include forming a second redistribution wiring layer on the sealing member, the second redistribution wiring layer having a plurality of second redistribution wires electrically connected to the plurality of conductive connectors on the sealing member; and mounting a second semiconductor device electrically connected to the plurality of second redistribution wires on the second redistribution wiring layer.

The method may further include grinding the upper surface of the sealing member such that upper surfaces of the plurality of conductive connectors and upper surfaces of the plurality of heat transfer plugs are exposed.

The method may further include forming a trench extending in the sealing member to surround the first semiconductor device on the peripheral region, the trench having a first depth from the upper surface of the sealing member; and forming a heat transfer plate by filling up the trench with the conductive material.

The one or more of the plurality of conductive connectors may have a first height from an upper surface of the first redistribution wiring layer to an upper surface of the sealing member, wherein the heat transfer plate has a first depth from the upper surface of the sealing member, and wherein the first height is greater than the first depth.

A distance between a first heat plug and a second heat plug, among the plurality of heat transfer plugs, is in a range of 50 μm to 500 μm.

A height of one or more of the plurality of heat transfer plugs is in a range of 20 μm to 300 μm.

A diameter of one or more of the plurality of heat transfer plugs is within a range of 20 μm to 100 μm.

The plurality of heat transfer plugs comprises at least one of nickel (Ni), antimony (Sb), bismuth (Bi), zinc (Zn), indium (In), palladium (Pd), platinum (Pt), aluminum (Al), copper (Cu), Molybdenum (Mo), titanium (Ti), gold (Au), silver (Ag), chromium (Cr), or tin (Sn).

The sealing member comprises at least one of epoxy resin, UV resin, polyurethane resin, silicone resin or silica filler.

According to another aspect of the disclosure, there is provided a method of manufacturing a semiconductor package, including forming a first redistribution wiring layer having a chip mounting region and a peripheral region surrounding the chip mounting region; forming a sealing member on the first redistribution wiring layer, the sealing member provided on an upper surface and a side surface of a first semiconductor device mounted on the chip mounting region of the first redistribution wiring layer; forming a plurality of conductive connectors on the peripheral region of the first redistribution wiring layer, the plurality of conductive connectors penetrating the sealing member and electrically connected to a plurality of plurality of first redistribution wires of the first redistribution wiring layer; forming a plurality of through openings extending from an upper surface of the sealing member towards an upper surface of the first semiconductor device to expose the upper surface of the first semiconductor device; forming a trench in the sealing member to extend from the upper surface of the sealing member in the peripheral region, the trench surrounding the first semiconductor device to be spaced apart from the first semiconductor device; and forming a plurality of heat transfer plugs and a heat transfer by filling up the through openings and the trench with a conductive material.

The method may further include forming a second redistribution wiring layer on the sealing member, the second redistribution wiring layer having a plurality of second redistribution wires electrically connected to the plurality of conductive connectors on the sealing member; and mounting a second semiconductor device electrically connected to the plurality of second redistribution wires on the second redistribution wiring layer.

The method may further include grinding the upper surface of the sealing member until upper surfaces of the plurality of conductive connectors, the plurality of heat transfer plugs and the heat transfer plate are exposed.

The one or more of the plurality of conductive connectors has a first height from an upper surface of the first redistribution wiring layer to an upper surface of the sealing member, wherein the heat transfer plate has a first depth from the upper surface of the sealing member, and wherein the first height is greater than the first depth.

According to another aspect of the disclosure, there is provided a semiconductor package, including: a first redistribution wiring layer comprising a chip mounting region and a peripheral region surrounding the chip mounting region, the first redistribution wiring layer having a plurality of first redistribution wires stacked in at least two layers; a semiconductor chip provided on the chip mounting region of the first redistribution wiring layer, wherein a first surface of the semiconductor chip on which chip pads are provided faces the first redistribution wiring layer, and the semiconductor chip is mounted on the first redistribution wiring layer via conductive bumps provided on the chip pads; a sealing member provided on an upper surface and a side surface of the semiconductor chip; a plurality of conductive connectors penetrating the sealing member and electrically connected to the plurality of first redistribution wires on the peripheral region; a plurality of heat transfer plugs extending from an upper surface of the sealing member to an upper surface of the semiconductor chip on the chip mounting region; and a second redistribution wiring layer provided on the sealing member and having a plurality of second redistribution wires that are electrically connected to the plurality of conductive connectors.

Thus, the heat transfer plugs formed of the conductive materials may receive heat from the first semiconductor device mounted in the chip mounting region. Since the heat transfer plugs extend from the upper surface of the sealing member, the heat may be transferred to the upper surface of the sealing member. Since the heat transfer plugs may have an uneven structure, a convection phenomenon inside the semiconductor package may be increased. Due to the convection phenomenon, the heat transfer plugs may quickly dissipate the heat to outside of the semiconductor package.

Also, in the manufacturing method of the semiconductor package, the through openings may be formed using the same process as a process of forming a through silicon via (TSV). The manufacturing method of the semiconductor package may not use a front end of line (FEOL) process or a back end of line (BEOL) process. The manufacturing method of the semiconductor package may reduce process difficulty and cost by simplifying the process.

BRIEF DESCRIPTION OF THE DRAWINGS

An example embodiment of the disclosure will be more clearly understood from the following detailed description taken in conjunction with the accompanying drawings. FIGS. 1 to 22 represent non-limiting, an example embodiment as described herein.

FIG. 1 is a cross-sectional view illustrating a semiconductor package in accordance with an example embodiment.

FIG. 2 is an enlarged cross-sectional view illustrating portion 'A' in FIG. 1.

FIG. 3 is a plan view illustrating an upper surface of a sealing member in FIG. 1.

FIGS. 4 to 14 are cross-sectional views illustrating a method of manufacturing a semiconductor package in accordance with an example embodiment.

FIG. 15 is a plan view illustrating a semiconductor package having a heat transfer plate in accordance with an example embodiment.

FIG. 16 is an enlarged cross-sectional view illustrating portion 13' in FIG. 15.

FIG. 17 is a plan view illustrating an upper surface of a sealing member in FIG. 15.

FIGS. 18 to 22 are cross-sectional views illustrating a method of manufacturing the semiconductor package in FIG. 15 in accordance with an example embodiment.

DETAILED DESCRIPTION

Hereinafter, various example embodiments of the disclosure will be explained in detail with reference to the accompanying drawings.

The various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As used herein, an expression "at least one of" preceding a list of elements modifies the entire list of the elements and does not modify the individual elements of the list. For example, an expression, "at least one of a, b, and c" should be understood as including only a, only b, only c, both a and b, both a and c, both b and c, or all of a, b, and c.

The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings. Although the terms first, second, etc. may be used herein to describe various elements, these elements should not be limited by these terms. These terms are generally only used to distinguish one element from another.

Figure 1:
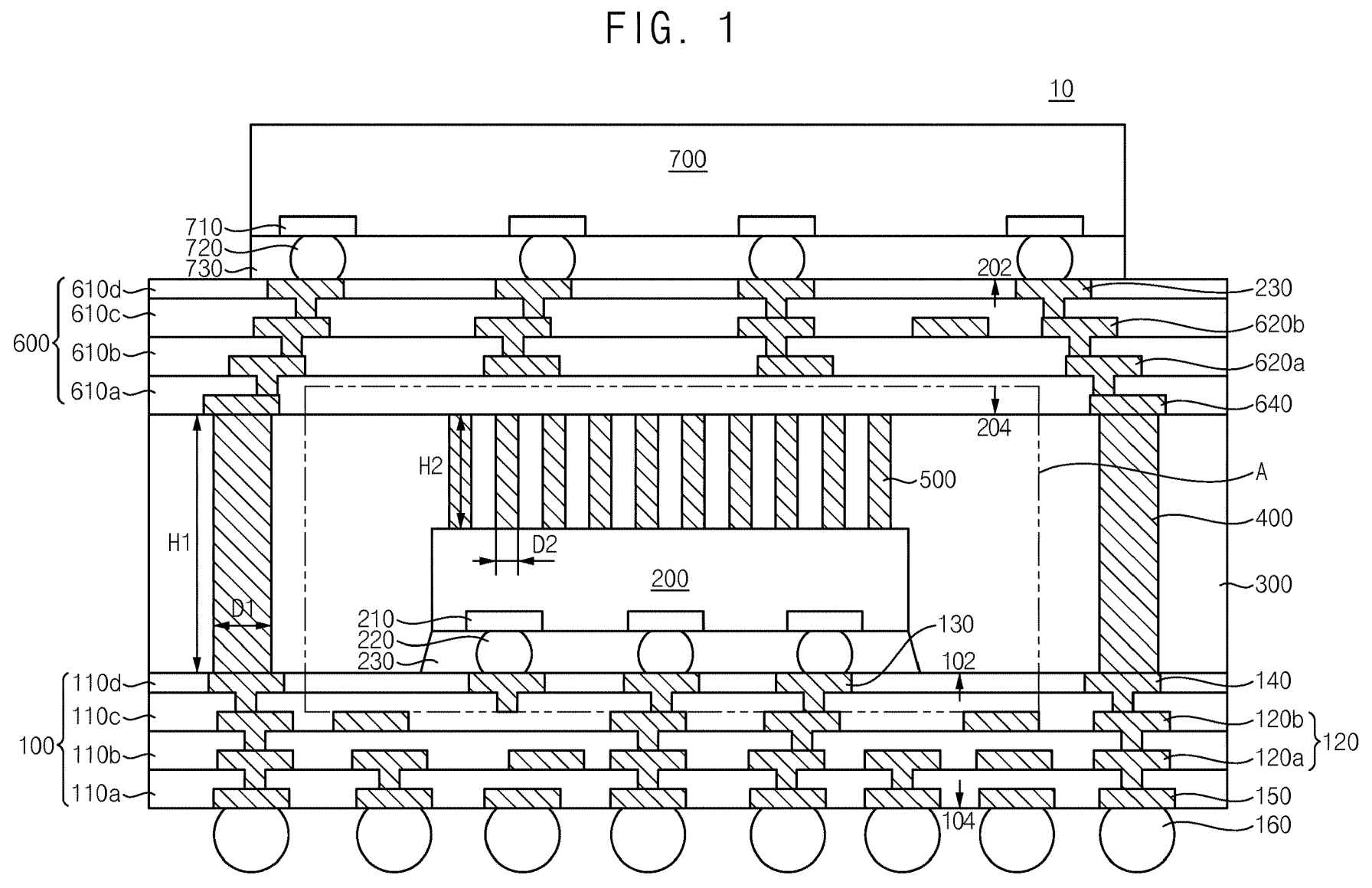
Figure 2:
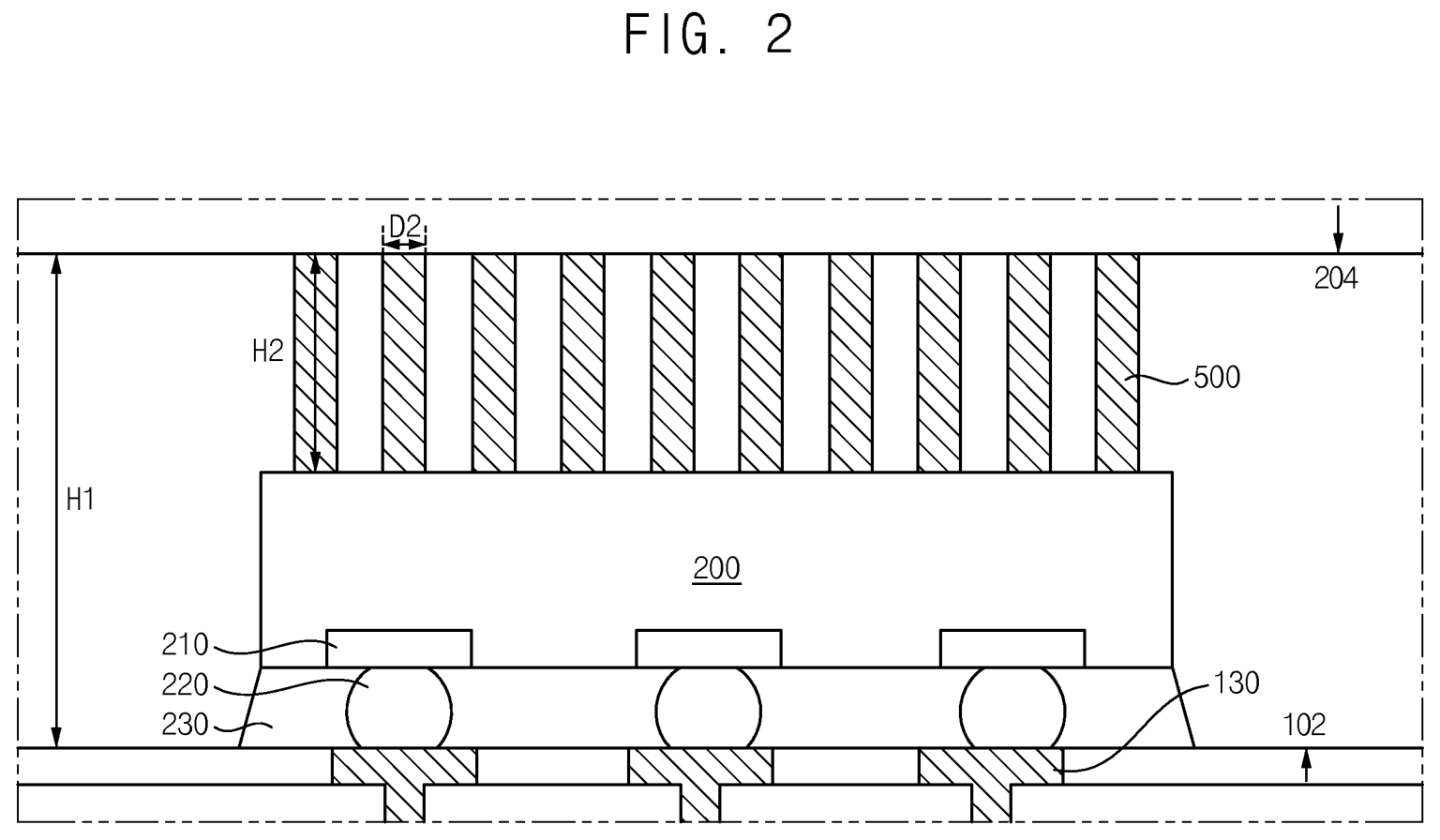
Figure 3:
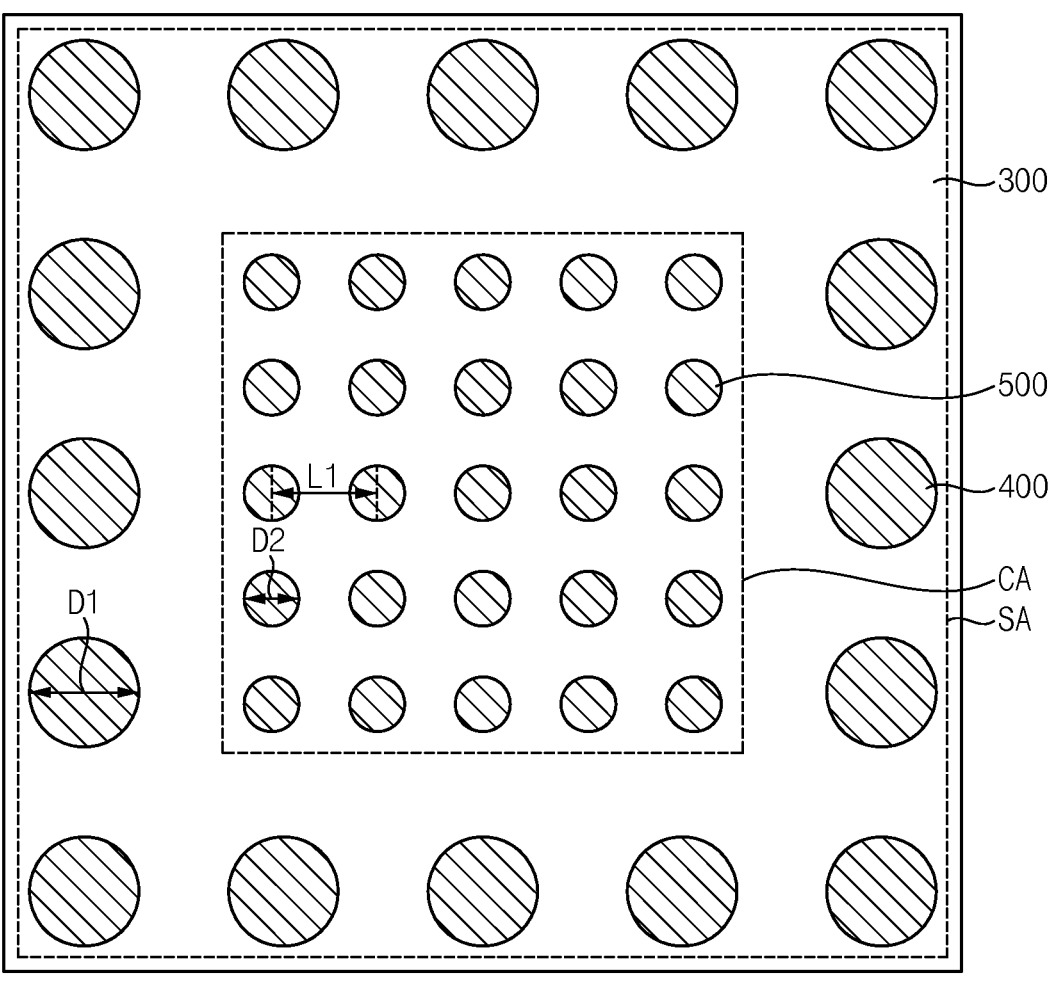

FIG. 1 is a cross-sectional view illustrating a semiconductor package in accordance with an example embodiment. FIG. 2 is an enlarged cross-sectional view illustrating portion 'A' in FIG. 1. FIG. 3 is a plan view illustrating an upper surface of a sealing member in FIG. 1.

Referring to FIGS. 1 to 3, a semiconductor package 10 may include a first redistribution wiring layer 100, a first semiconductor device 200 arranged on the first redistribution wiring layer 100, a sealing member 300 provided on the first redistribution wiring layer 100, conductive connectors 400 penetrating the sealing member 300 and electrically connected to the first redistribution wiring layer 100, and a plurality of heat transfer plugs 500 penetrating the sealing member 300. According to an example embodiment, the sealing member 300 may cover or encapsulate the first semiconductor device 200. The semiconductor package 10 may further include a second redistribution wiring layer 600 arranged on the sealing member 300, and a second semiconductor device 700 arranged on the second redistribution wiring layer 600.

In an example embodiment, the first redistribution wiring layer 100 may include a plurality of redistribution wires 120. The first redistribution wiring layer 100 may include a first upper surface 102 and a first lower surface 104 opposite to each other. The first redistribution wiring layer 100 may include a plurality of first bonding pads 130 and a plurality of second bonding pads 140 provided to be exposed on the upper surface of the first redistribution wiring layer 100 (i.e., the first upper surface 102). The first redistribution wiring layer 100 may include a plurality of first connecting pads 150 provided to be exposed on the lower surface of the first redistribution wiring layer 100 (i.e., the first lower surface 104). The number of first bonding pads 130 and second bonding pads 140 are not limited to the illustration in FIG. 1, and as such, according to another example embodiment, the number of first bonding pads 130 and second bonding pads 140 may be one or more.

Referring to FIG. 3, the first redistribution wiring layer 100 may include a chip mounting region CA where the first semiconductor device 200 is mounted, and a peripheral region SA surrounding the chip mounting region CA. The plurality of first bonding pads 130 on which the first semiconductor device 200 is mounted may be provided in the chip mounting region CA. The plurality of second bonding pads 140 through which the conductive connectors 400 extend may be provided in the peripheral region SA.

Referring to FIG. 1, in an example embodiment, the first redistribution wiring layer 100 may include a plurality of insulating films, including a first insulating film 110a, a second insulating film 110b, a third insulating film 110c and a fourth insulating film 110d and redistribution wires 120 provided in the insulating films. However, the disclosure is not limited thereto, and as such, according to another example embodiment, the number of insulating films may be more than four or less than four. The redistribution wires 120 may include first redistribution wiring 120a and second redistribution wiring 120b. However, the disclosure is not limited thereto, and as such, according to another example embodiment, the number of redistribution wirings may be more than two or less than two. The insulating film may include a polymer or a dielectric layer. The insulating film may be formed by a vapor deposition process, a spin coating process, or the like. The redistribution wiring may be formed by a plating process, an electroless plating process, a vapor deposition process, or the like. The redistribution wire may electrically connect the first and second semiconductor devices 200 and 700.

In an example embodiment, the insulating films 110 may cover the redistribution wires 120. According to an example embodiment, the redistribution wires 120 may be embedded in the insulating films 110. For example, the first redistribution wiring 120a may be embedded in the second insulating film 110b and the second redistribution wiring 120b may be embedded in the third insulating film 110c. The first insulating film 110a may be provided on the first lower surface 104 of the first redistribution wiring layer 100, and the fourth insulating film 110d (uppermost insulating film) may be provided on the first upper surface 102 of the first redistribution wiring layer 100.

According to an example embodiment, the plurality of first bonding pads 130 and the plurality of second bonding pads 140 may be provided in the fourth insulating film 110d. Upper surfaces of each of the plurality of first bonding pads 130 and the plurality of second bonding pads 140 may be exposed from the upper surface of the fourth insulating film 110d (i.e., the first upper surface 102).

The plurality of first connecting pads 150 may be provided in the first insulating film 110a. A lower surface of the plurality of first connecting pads 150 may be exposed from the lower surface of the first insulating film 110a (i.e., the first lower surface 104). The first insulating film 110a may have a plurality of first openings that expose an upper surface of the plurality of first connecting pads 150.

The first redistribution wiring 120a may be provided on the first insulating film 110a and may contact the first connecting pad 150 through the plurality of first openings. The second insulating film 110b may be provided on the first insulating film 110a and may have a plurality of second openings that expose the first redistribution wiring 120a. The second redistribution wiring 120b may be provided on the second insulating film 110b and may contact the first redistribution wiring 120a through the plurality of second openings. The third insulating film 110c may be provided on the second insulating film 110b and may have a plurality of third openings that expose the second redistribution wiring 120b.

The first bonding pad 130 may be provided on the third insulating film 110c and may contact the second redistribution wiring 120b through the plurality of openings third openings. The fourth insulating film 110d may be provided on the third insulating film 110c and may have a plurality of fourth openings that expose the plurality of first bonding pads 130 and the plurality of second bonding pads 140. Accordingly, the plurality of first bonding pads 130 may be exposed from the upper surface of the fourth insulating film 110d, that is, the first upper surface 102.

The plurality of first bonding pads 130, the plurality of second boding pads 140, the plurality of first connecting pads 150, and the redistribution wires 120 may include a metal material. For example, the metal material may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof.

In an example embodiment, the first redistribution wiring layer 100 may be connected to other semiconductor devices through solder bumps 160. For example, the solder bumps 160 may be conductive connection members that connect the first redistribution wiring layer 100 to other electronic components or devices. The solder bumps 160 may be provided on the plurality of first connecting pads 150. For example, the solder bumps 160 may include C4 bumps. The first plurality of connecting pads 150 of the first redistribution wiring layer 100 may be electrically connected to substrate pads of a package substrate thorough solder bumps 160.

In an example embodiment, the first semiconductor device 200 may be arranged on the first redistribution wiring layer 100. The first semiconductor device 200 may be mounted on the first redistribution wiring layer 100 by a flip chip bonding method. The first semiconductor device 200 may include an active surface on which a plurality of first chip pads 210 are provided. In this case, the first semiconductor device 200 may be mounted on the first redistribution wiring layer 100 such that the active surface on which the plurality of first chip pads 210 are formed faces the first redistribution wiring layer 100. The plurality of first chip pads 210 of the first semiconductor device 200 may be electrically connected to the plurality of first bonding pads 130 of the first redistribution wiring layer 100 through a plurality of first conductive bumps 220 as conductive connection members. For example, the plurality of first conductive bumps 220 may include micro bumps (uBumps).

According to an example embodiment, a first adhesive member 230 may be provided between the first redistribution wiring layer 100 and the first semiconductor device 200. For example, the first adhesive member 230 may include an epoxy material.

In an example embodiment, the sealing member 300 may be provided on and/or around the first redistribution wiring layer 100, the first semiconductor device 200, the conductive connectors 400 and the heat transfer plugs 500. For example, the sealing member 300 may cover the first redistribution wiring layer 100, the first semiconductor device 200, the conductive connectors 400 and the heat transfer plugs 500. The sealing member 300 may be provided on the first redistribution wiring layer 100 to fill a space between the first redistribution wiring layer 100 and the second redistribution wiring layer 600.

The sealing member 300 may include a plurality of first through openings in which the conductive connectors 400 are provided. For example, the conductive connectors 400 are respectively inserted in the plurality of first through openings. For example, one end of the conductive connectors 400 may be electrically connected to the second bonding pad 140 of the first redistribution wiring layer 100, and the other end of the conductive connectors 400 may be electrically connected to the second connecting pad 640 of the second redistribution wiring layer 600 in the first through opening. The conductive connectors 400 may be formed to have a first height H1 and a first diameter D1. The first height H1 of the conductive connectors 400 may be within a range of 200 μm to 500 μm. The first diameter D1 of the conductive connectors 400 may be within a range of 50 μm to 200 μm.

The sealing member 300 may include a plurality of second through openings in which the heat transfer plugs 500 are provided. For example, the heat transfer plugs 500 are respectively inserted in the plurality of second through openings. One end of the heat transfer plugs 500 may be exposed from an upper surface of the sealing member 300 and the other end of the heat transfer plugs 500 may contact an upper surface of the first semiconductor device 200 in the second through opening.

The second redistribution wiring layer 600 may be arranged on the upper surface of the sealing member 300. The sealing member 300 may have a parallel upper region on which the second redistribution wiring layer 600 is arranged. For example, the sealing member 300 may include an epoxy molding compound (EMC). The sealing member 300 may include UV resin, polyurethane resin, silicone resin, or silica filler.

In an example embodiment, the conductive connectors 400 may vertically penetrate the sealing member 300 to electrically connect the first redistribution wiring layer 100 and the second redistribution wiring layer 600. The conductive connectors 400 may be provided in the first through opening of the sealing member 300. The conductive connectors 400 may extend from the first redistribution wiring layer 100 in a same vertical direction as a thickness direction of the first redistribution wiring layer 100. Although two connectors 400 are illustrated in FIG. 1, the disclosure is not limited thereto, and as such, according to another example embodiment, the number of connectors may be more than two or less than two.

The conductive connectors 400 may be provided on the first redistribution wiring layer 100. The conductive connectors 400 may be provided in the peripheral region SA surrounding the chip mounting region CA. The conductive connectors 400 may be provided outside the first semiconductor device 200 mounted on the chip mounting region CA.

According to an example embodiment, the conductive connectors 400 may be electrically connected to the second bonding pad 140 of the first redistribution wiring layer 100. The conductive connectors 400 may be electrically connected to the second connecting pad 640 of the second redistribution wiring layer 600. The conductive connectors 400 may provide a signal movement path for electrically connecting the first and second redistribution wiring layers 100, 600.

The conductive connectors 400 may have a first height H1 and may be provided between the first and second redistribution wiring layers 100 and 600. The first height H1 of the conductive connectors 400 may be a same as a distance from the first upper surface 102 of the first redistribution wiring layer 100 to a second lower surface 604 of the second redistribution wiring layer 600. The conductive connectors 400 may have a first diameter D1. For example, the first height H1 may be within a range of 200 μm to 500 μm. The first diameter D1 may be within a range of 50 μm to 200 μm.

For example, the conductive connectors 400 may include a pillar shape or a bump shape. The conductive connectors 400 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn). The conductive connectors 400 may be formed by a plating process, an electroless plating process, a vapor deposition process, or the like.

In an example embodiment, the plurality of heat transfer plugs 500 may be provided penetrating through the sealing member 300 in the vertical direction. The heat transfer plugs 500 may extend from the upper surface of the sealing member 300 in the vertical direction. The heat transfer plugs 500 may be provided in the second through opening of the sealing member 300. The heat transfer plugs 500 may have a uneven structure in the sealing member 300. The heat transfer plugs 500 may increase convection phenomenon through the uneven structure. The number of heat transfer plugs 500 not limited to the illustration in FIG. 1, and as such, according to another example embodiment, the number of heat transfer plugs 500 may be one or more.

The heat transfer plugs 500 may be provided in the chip mounting region CA of the first redistribution wiring layer 100 on which the first semiconductor device 200 is mounted. Heat may be emitted from the chip mounting region CA where the first semiconductor device 200 is mounted. The heat transfer plugs 500 provided on the chip mounting region CA may absorb the heat emitted from the first semiconductor device 200. The heat transfer plugs 500 may transfer heat that is generated in the first semiconductor device 200 to the upper surface of the sealing member 300. The number of heat transfer plugs 500 on the chip mounting region CA may be within a range of 20 to 200.

One side of the heat transfer plugs 500 may contact the upper surface of the first semiconductor device 200. When the one side of the heat transfer plugs 500 contacts the upper surface of the first semiconductor device 200, the heat transfer plugs 500 may have a high heat transfer coefficient (W/mK).

The heat transfer plugs 500 may have a second height H2 from the upper surface of the sealing member 300. The heat transfer plugs 500 may transfer the heat generated in the first semiconductor device 200 by a second height H2. The second height H2 of the heat transfer plugs 500 may be smaller than the first height H1 of the conductive connectors 400. For example, the second height H2 may be within a range of 20 μm to 300 μm.

The heat transfer plugs 500 may have a second diameter D2. As the second diameter D2 of the heat transfer plugs 500 increases, the heat transfer plugs 500 may transfer more of the heat from the first semiconductor device 200 to the upper surface of the sealing member 300. For example, the second diameter D2 may be within a range of 20 μm to 100 μm.

The heat transfer plugs 500 may be positioned at a predetermined first distance L1 from a center of the second diameter D2. The first distance L1 may be within a range of 50 μm to 500 μm. As the first distance L1 between the heat transfer plugs 500 decreases, more heat transfer plugs 500 may be inserted into the sealing member 300.

For example, the heat transfer plugs 500 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn).

In an example embodiment, the second redistribution wiring layer (upper redistribution wiring layer) 600 may have a second upper surface 602 and the second lower surface 604 opposite to each other. The second redistribution wiring layer 600 may include a plurality of third bonding pads 630 that are exposed on the second upper surface 602, and a plurality of second connecting pads 640 that are exposed from the second lower surface 604. The second redistribution wiring layer 600 may be arranged on the upper surface of the sealing member 300. The second semiconductor device 700 may be arranged on the second redistribution wiring layer 600.

The second redistribution wiring layer 600 may be electrically connected to the first redistribution wiring layer 100 through the conductive connectors 400 electrically connected to the second connecting pad 640. The conductive connectors 400 may penetrate through the sealing member 300 to electrically connect the first and second redistribution wiring layers 100, 600.

The heat transfer plugs 500 may be provided on the second lower surface 604 of the second redistribution wiring layer 600 to be exposed from the upper surface of the sealing member 300. The second redistribution wiring layer 600 may receive the heat generated from the first semiconductor device 200 through the heat transfer plugs 500. The second redistribution wiring layer 600 may receive the heat from the heat transfer plugs 500 in the chip mounting region CA. The second redistribution wiring layer 600 may transfer the heat that is received from the second lower surface 604 to the second upper surface 602.

In an example embodiment, the second redistribution wiring layer 600 may include a plurality of insulating films 610a, 610b, 610c and 610d, and redistribution wires 620 provided in the insulating films. The redistribution wires 620 may include third and fourth redistribution wires 620a and 620b.

According to an example embodiment, the plurality of third bonding pads 630 may be provided in the eighth insulating film (uppermost insulating film) 610d. An upper surface of the third bonding pad 630 may be exposed from the upper surface of the eighth insulating film 610d, that is, the second upper surface 602. The eighth insulating film 610d may have an eighth opening that exposes the upper surface of the third bonding pad 630.

The plurality of second connecting pads 640 may be provided in the fifth insulating film 610a. A lower surface of the second connecting pad 640 may be exposed from a lower surface of the fifth insulating film 610a, that is, the second lower surface 604. The fifth insulating film 610a may have a fifth opening that exposes an upper surface of the second connecting pad 640.

The third redistribution wire 620a may be provided on the fifth insulating film 610a and may contact the second connecting pad 640 through the fifth opening. The sixth insulating film 610b may be provided on the fifth insulating film 610a and may have a sixth opening that exposes the third redistribution wire 620a. The fourth redistribution wire 620b may be provided on the sixth insulating film 610b and may contact the third redistribution wire 620a through the sixth opening. The seventh insulating film 610c may be provided on the sixth insulating film 610b and may have a seventh opening that exposes the fourth redistribution wire 620b.

The third bonding pad 630 may be provided on the seventh insulating film 610c and may contact the fourth redistribution wire 620b through the seventh opening. The eighth insulating film 610d may be provided on the seventh insulating film 610c and may have the eighth opening that exposes the third bonding pad 630. Accordingly, the plurality of third bonding pads 630 may be exposed from the upper surface of the eighth insulating film 610d, that is, the second upper surface 602.

In an example embodiment, the second semiconductor device 700 may be arranged on the second redistribution wiring layer 600. The second semiconductor device 700 may be mounted on the second redistribution wiring layer 600 by a flip chip bonding method. In this case, the second semiconductor device 700 may be mounted on the second redistribution wiring layer 600 such that an active surface on which second chip pads 710 are formed faces the second redistribution wiring layer 600.

The second chip pads 710 of the second semiconductor device 700 may be electrically connected to the third bonding pads 630 of the second redistribution wiring layer 600 through second conductive bumps 720 as conductive connection members. For example, the second conductive bumps 720 may include micro bumps (uBumps).

A second adhesive member 730 may be provided between the second redistribution wiring layer 600 and the second semiconductor device 700. For example, the second adhesive member 730 may include an epoxy material.

Hereinafter, a method of manufacturing the semiconductor package in FIG. 1 will be described.

FIGS. 4 to 14 are cross-sectional views illustrating a method of manufacturing a semiconductor package in accordance with an example embodiment.

Figure 4:
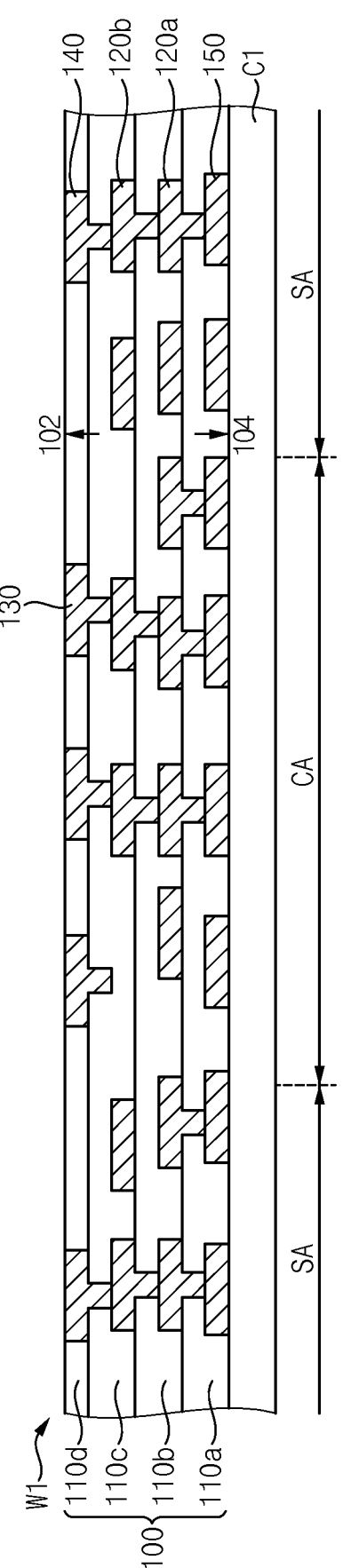

Referring to FIG. 4, a semiconductor wafer W1 having first redistribution wiring layers 100 may be provided on a carrier substrate Cl. The first redistribution wiring layer 100 may include a chip mounting region CA in which a first semiconductor device 200 is mounted and a peripheral region SA surrounding the chip mounting region CA.

According to an example embodiment, a plurality of first connecting pads 150 may be formed on the carrier substrate Cl, and a first insulating film 110a may be formed on the first connecting pads 150. Then, the first insulating film 110a may be patterned to from first openings that expose the plurality of first connecting pads 150.

For example, the first insulating film 110a may include a polymer or a dielectric layer. According to an example embodiment, the first insulating film 110a may include polyimide (PI), lead oxide (PbO), polyhydroxystyrene (PHS), novolac, or the like. The first insulating film 110*a* may be formed by a vapor deposition process, a spin coating process, or the like.

According to an example embodiment, first redistribution wires 120*a* may be formed on the first insulating film 110*a* to directly contact the plurality of first connecting pads 150 through the first openings respectively.

According to an example embodiment, after a seed layer is formed in a portion of the first insulating film 110*a* and the first opening, the seed layer may be patterned and an electrolytic plating process may be performed to form the first redistribution wiring 120*a*. Accordingly, at least a portion of the first redistribution wiring 120*a* may directly contact each of the plurality of first connecting pads 150 through the first opening.

For example, the first redistribution wire may include aluminum (Al), copper (Cu), tin (Sn), nickel (Ni), gold (Au), platinum (Pt), or an alloy thereof.

According to an example embodiment, after a second insulating film 110*b* is formed on the first insulating film 110*a* to cover the first redistribution wiring 120*a*, the second insulating film 110*b* may be patterned to form a second opening that expose the first redistribution wiring 120*a*. A second redistribution wiring 120*b* may be formed on the second insulating film 110*b* to directly contact the first redistribution wiring 120*a* through the second opening.

According to an example embodiment, after a third insulating film 110*c* is formed on the second insulating film 110*b* to cover the second redistribution wires 120*b*, the third insulating film 110*c* may be patterned to form a third opening that expose the second redistribution wiring 120*b*. First bonding pads 130 and second bonding pads 140 may be formed on the third insulating film 110*c* to directly contact the second redistribution wires 120*b* through the third openings respectively. The first bonding pads 130 may be formed in the peripheral region SA and the second bonding pads 140 may be formed in the chip mounting region CA.

According to an example embodiment, after a fourth insulating film 110*d* is formed on the third insulating film 110*c* to cover the first bonding pads 130 and the second bonding pads 140, respectively, the fourth insulating film 110*d* may be patterned to form fourth openings that expose the first bonding pads 130 and the second bonding pads 140, respectively.

Figure 5:
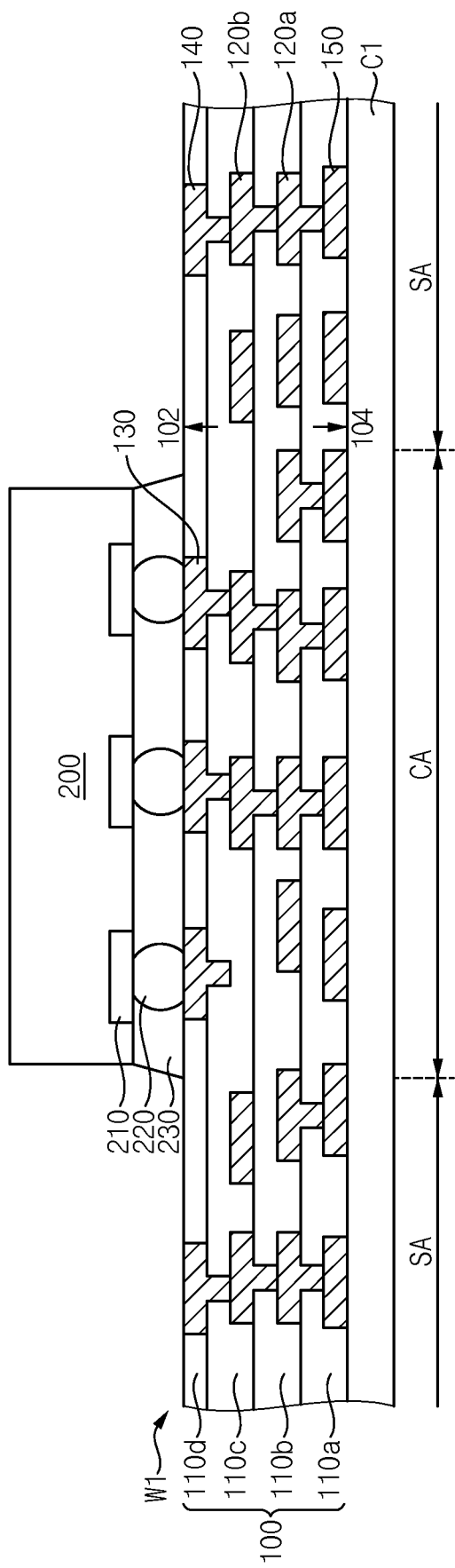
Figure 6:
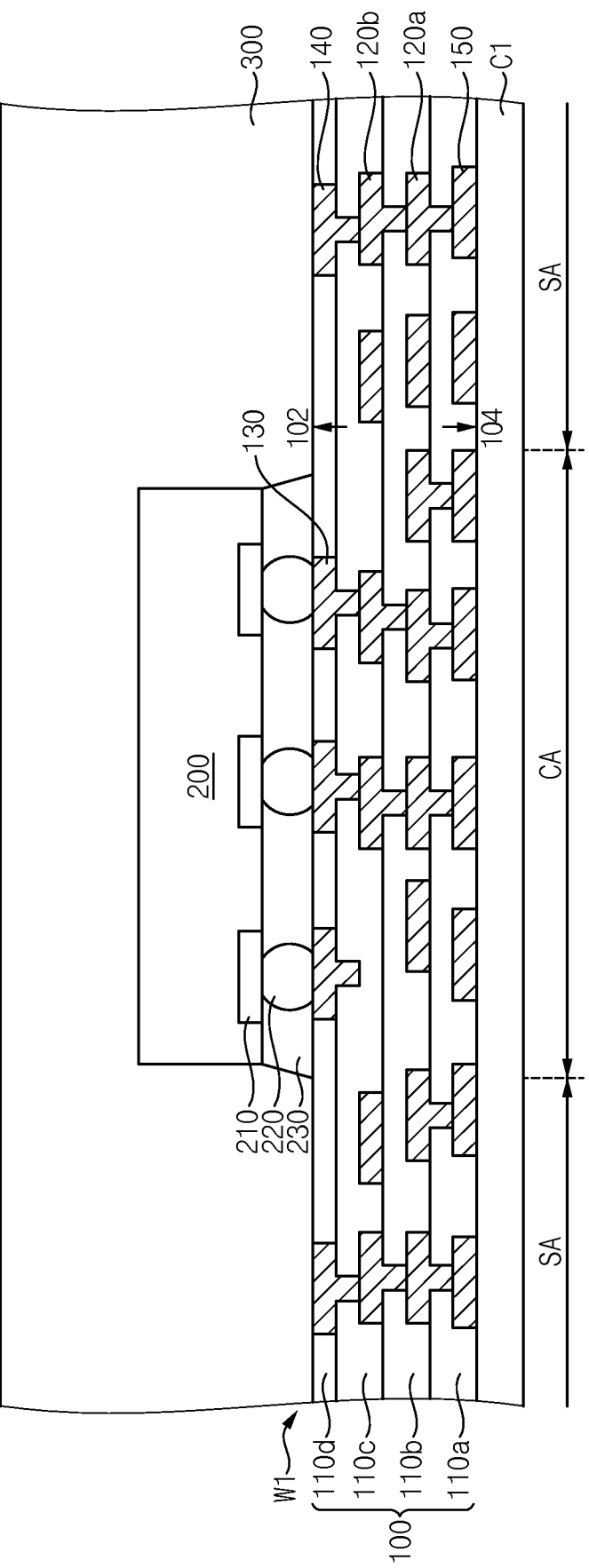

Referring to FIGS. 5 and 6, after the first semiconductor device 200 is mounted on the first redistribution wiring layer 100 of the semiconductor wafer W1, a sealing member 300 may be formed on the first redistribution wiring layer 100 to cover the first semiconductor device 200.

In an example embodiment, the first semiconductor device 200 may be mounted on the first redistribution wiring layer 100 by a flip chip bonding method. The first semiconductor device 200 may be mounted on the chip mounting region CA of the first redistribution wiring layer 100. First chip pads 210 of the first semiconductor device 200 may be electrically connected to the first bonding pads 130 of the first redistribution wiring layer 100 through first conductive bumps 220. For example, the first conductive bumps 220 may include micro bumps (uBumps).

For example, the sealing member 300 may include an epoxy molding compound (EMC). The sealing member 300 may include UV resin, polyurethane resin, silicone resin, or silica filler. However, the disclosure is not limited thereto, and as such, the he sealing member 300 may include other materials.

Figure 7:
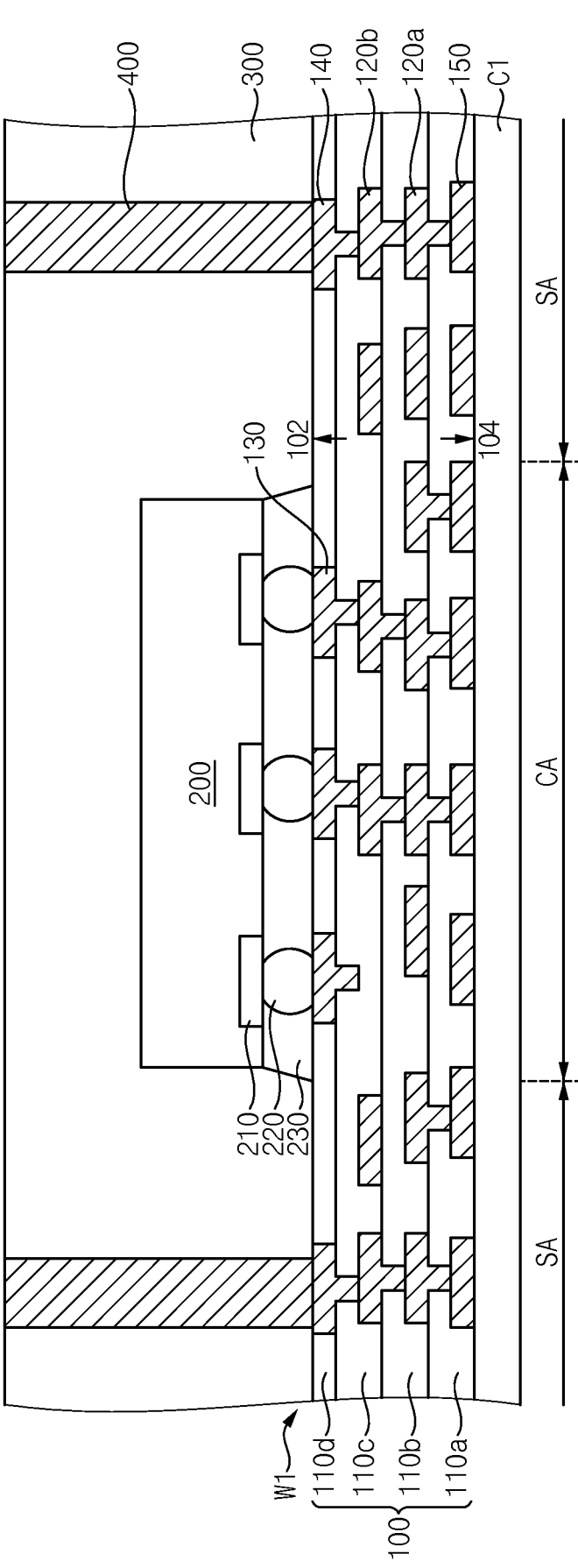

Referring to FIG. 7, a plurality of conductive connectors 400 penetrating the sealing member 300 may be formed on the first redistribution wiring layer 100. The plurality of conductive connectors 400 may penetrate the sealing member 300 in a vertical direction.

According to an example embodiment, a first photoresist layer may be provided on an upper surface of the sealing member 300. For example, the first photoresist layer may be formed to cover the upper surface of the sealing member 300. Then, an exposure process may be performed on the first photoresist layer to form first through openings that expose the second bonding pads 140, respectively.

The conductive connectors 400 may be formed on the first through openings that penetrate the first photoresist layer in the vertical direction. A first plating process may be performed on the first through openings to form the conductive connectors 400. For example, the conductive connectors 400 may be formed by a plating process, an electroless plating process, a vapor deposition process, or the like. The conductive connectors 400 may have a pillar shape or a bump shape.

According to an example embodiment, the first photoresist layer may be removed to form conductive connectors 400 that extend from the second bonding pads 140, respectively.

According to another example embodiment, the conductive connectors 400 may be first formed on the second bonding pads 140 of the first redistribution wiring layer 100, and the sealing member 300 may be formed on the first redistribution wiring layer 100 to cover the formed conductive connectors 400. The conductive connectors 400 may be formed on the peripheral region SA of the first redistribution wiring layer 100.

The conductive connectors 400 may be formed to have a first height H1 and a first diameter D1. The first height H1 of the conductive connectors 400 may be within a range of 200 μm to 500 μm. The first diameter D1 of the conductive connectors 400 may be within a range of 50 μm to 200 μm.

According to another example embodiment, the conductive connectors 400 may be formed on the first redistribution wiring layer 100 before mounting the first semiconductor device 200 on the first redistribution wiring layer 100. First, the conductive connectors 400 may be formed on the first redistribution wiring layer 100 through the first photoresist layer. Then, the first photoresist layer may be removed, and the first semiconductor device 200 may be mounted on the first redistribution wiring layer 100. Then, the sealing member 300 may be formed on the first redistribution wiring layer 100 to cover the first semiconductor device 200 and the conductive connectors 400.

Referring to FIGS. 8 to 12, a plurality of heat transfer plugs 500 may be formed on the first semiconductor device 200 to penetrate the sealing member 300 in the vertical direction.

Figure 8:
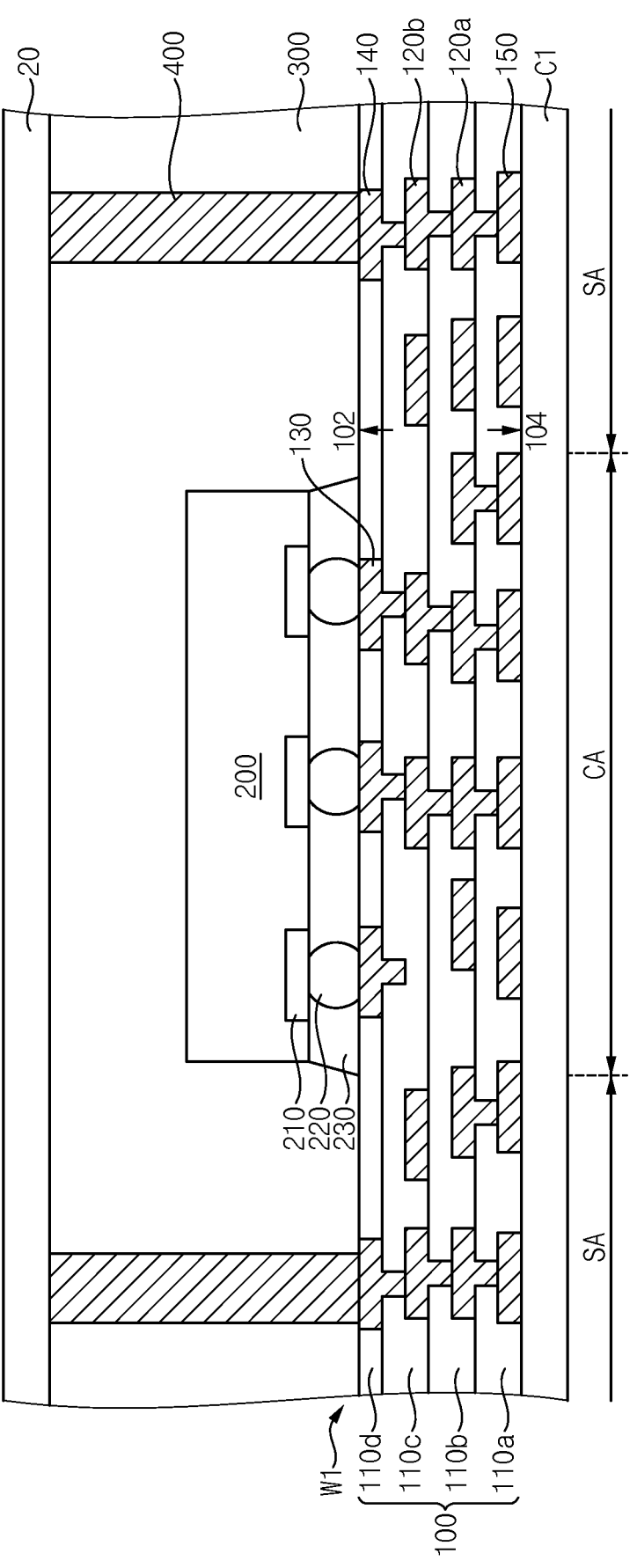
Figure 9:
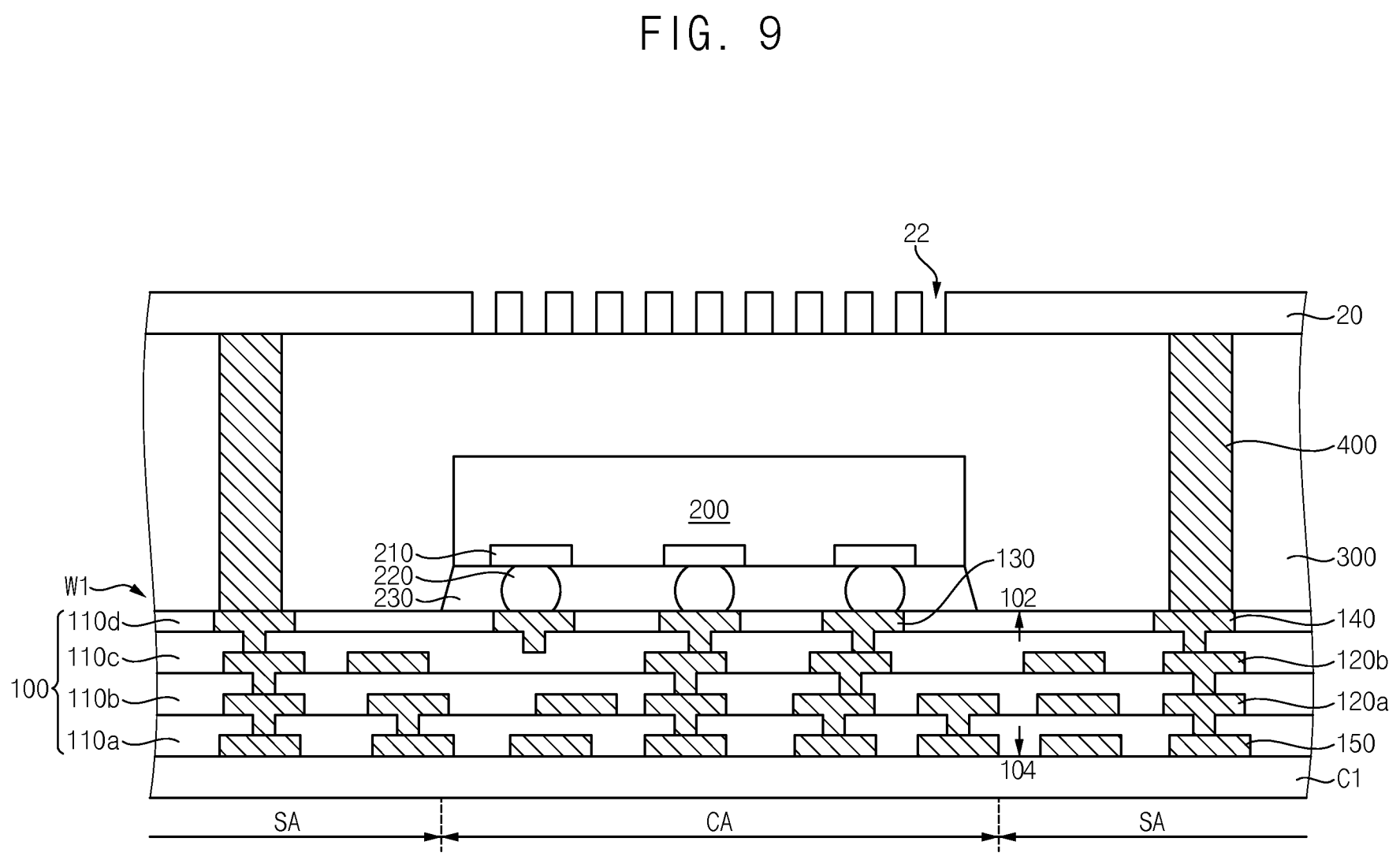

According to another example embodiment, a second photoresist layer 20 may be provided on the upper surface of the sealing member 300 as shown in FIG. 8. For example, the second photoresist layer 20 may be formed to cover the upper surface of the sealing member 300. Then, an exposure process may be performed on the second photoresist layer 20 to form a second photoresist pattern 22 that exposes regions of the heat transfer plugs 500 as shown in FIG. 9. Then, an etching process may be performed on the second photoresist pattern 22 to form second through openings 30 in the sealing member 300. The second through openings 30 may be formed in the sealing member 300 by the etching process. The second through openings 30 may be formed on the chip mounting region CA of the first redistribution wiring layer 100.

The etching process may include a wet etching process, a dry etching process, a plasma etching process, and the like. The wet etching process may be performed through an etchant that has an etching selectivity with respect to the sealing member 300. For example, the etchant may include water ($H_2O$), hydrogen peroxide ($H_2O_2$), citric acid ($C_6H_8O_7$), and the like. Portions of the sealing member 300 may be removed through the wet etching process.

For example, the dry etching process may include a physical etching process, a chemical etching process, and a physical chemical etching process. The plasma etching process may be performed using inductively coupled plasma, capacitively coupled plasma, microwave plasma, or the like.

Figure 10:
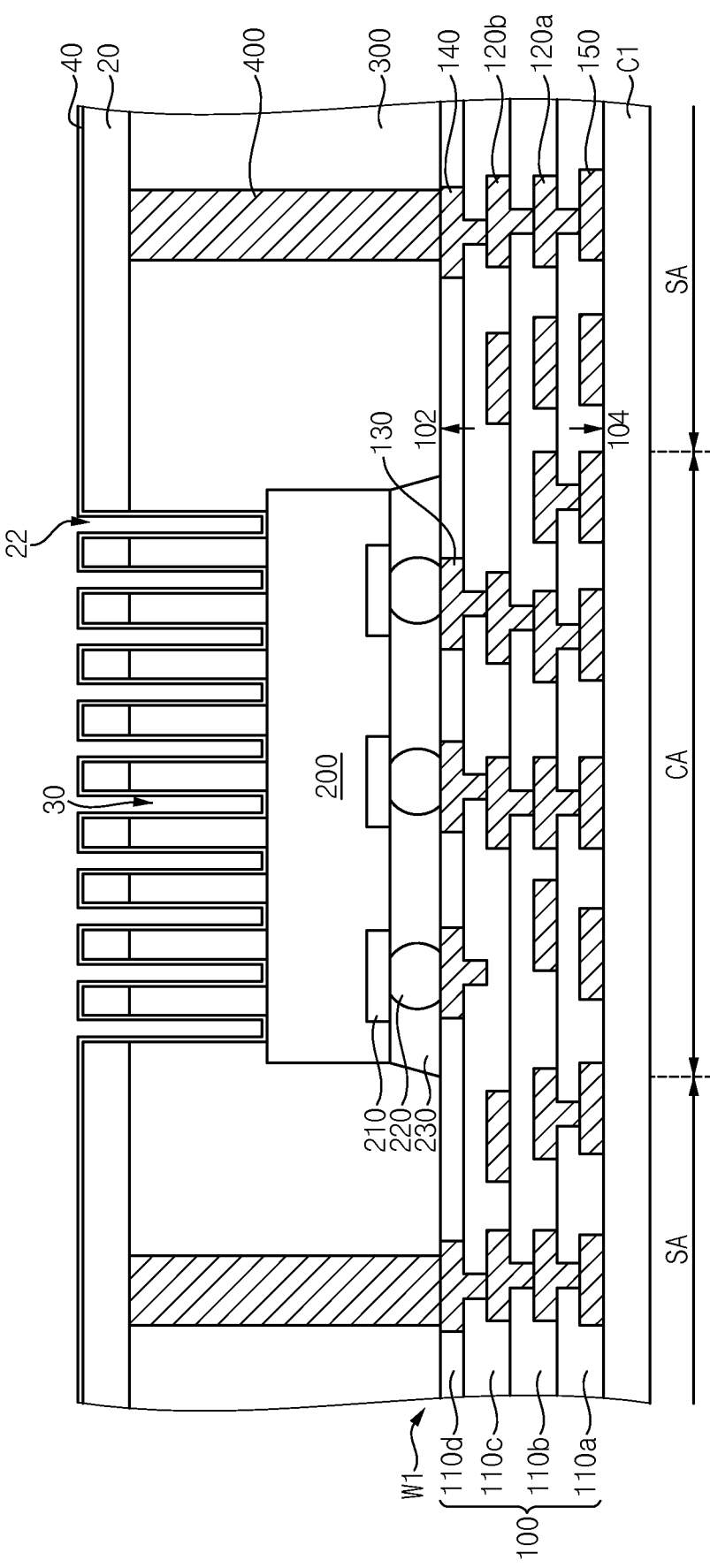

Then, a seed layer 40 may be formed on the second through openings 30 as shown in FIG. 10. The seed layer 40 may be formed in the second through openings 30 so as to form the heat transfer plugs 500. For example, the seed layer 40 may include titanium (Ti), titanium nitrogen compound (TiN), titanium oxygen compound ($TiO_2$), chromium nitrogen compound (CrN), titanium carbon nitrogen compound (TiCN), titanium aluminum nitrogen compound (TiAlN) or alloys thereof. The seed layer 40 may be formed by a sputtering process.

Figure 11:
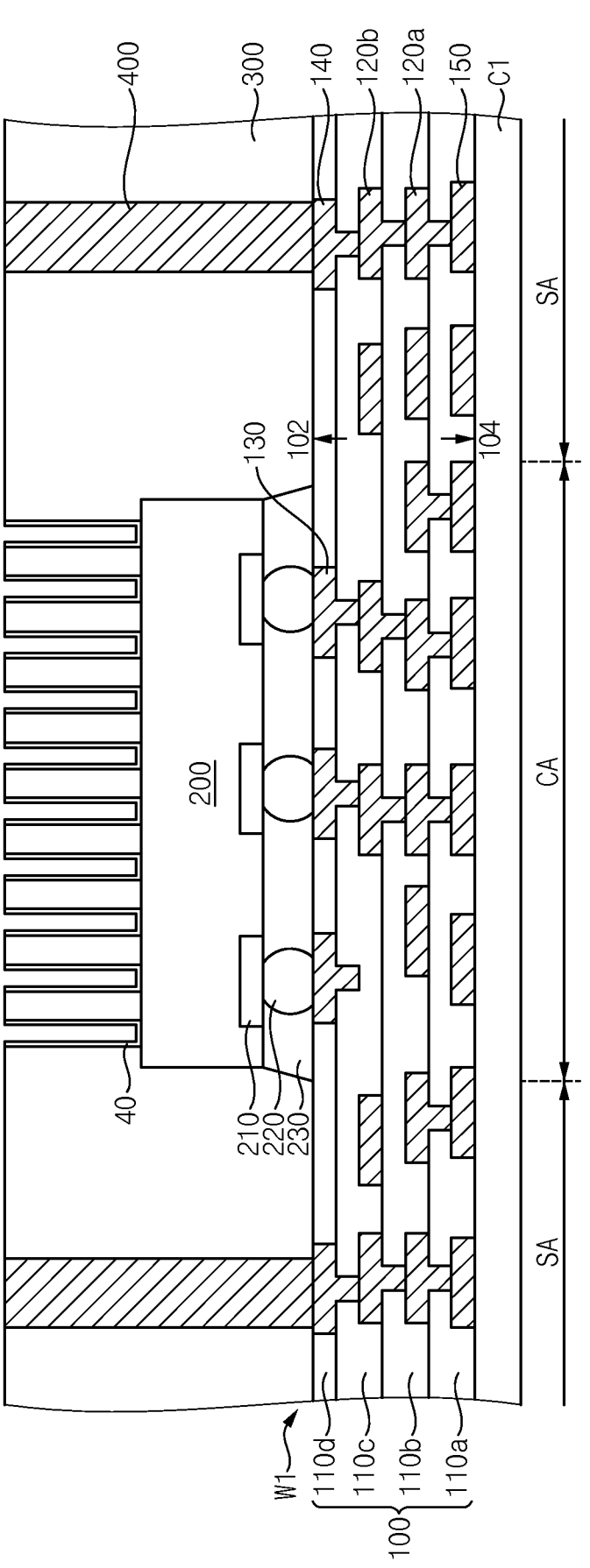
Figure 12:
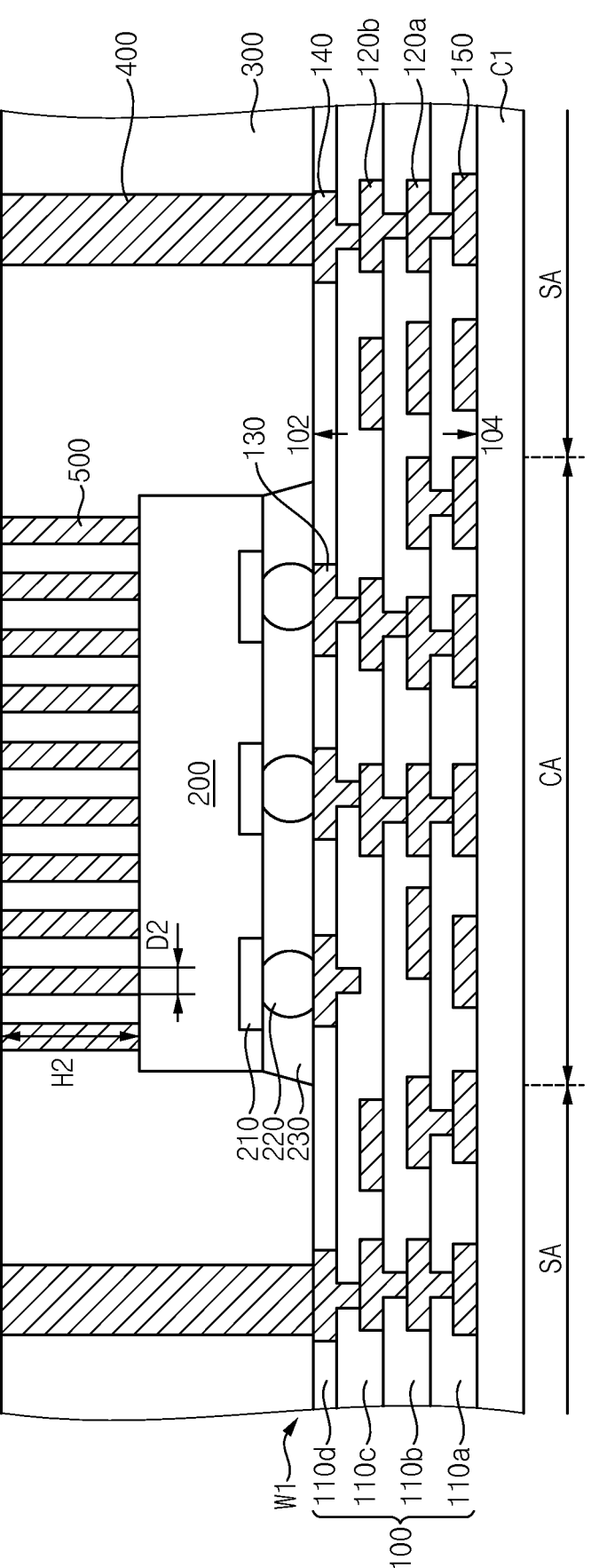

Then, the second photoresist layer 20 may be removed to form the heat transfer plugs 500 that extend from the upper surface of the sealing member 300 to the first semiconductor device 200 as shown in FIG. 11. The heat transfer plugs 500 may be formed to contact an upper surface of the first semiconductor device 200. The heat transfer plugs 500 may be formed to have an uneven structure. The heat transfer plugs 500 may increase convection phenomenon inside a semiconductor package 10 through the uneven structure. The heat transfer plugs 500 may quickly dissipate heat from the semiconductor package 10 to an outside through the convection phenomenon The heat transfer plugs 500 may be formed in the second through openings 30 as shown in FIG. 12. The second through openings 30 may be filled up with a conductive material to form the heat transfer plugs 500. The conductive material may be hardened in the second through openings 30 to form the heat transfer plugs 500. The heat transfer plugs 500 may be formed on the chip mounting region CA of the first redistribution wiring layer 100.

A second plating process may be performed on the second through openings 30 to form the heat transfer plugs 500. For example, the heat transfer plugs 500 may be formed by a plating process, an electroless plating process, a vapor deposition process, or the like. For example, the heat transfer plugs 500 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn).

Although the second photoresist layer 20 may be removed before the formation of the heat transfer plugs 500 according to an example embodiment, the disclosure is not limited thereto. As such, according to another example embodiment, the second photoresist layer 20 may be removed after the heat transfer plugs 500 are formed via the second plating process.

The upper surface of the sealing member 300 may be partially removed by a grinding process such as a chemical mechanical polishing (CMP) process. Accordingly, a thickness of the sealing member 300 may be reduced to a desired thickness. One end of the conductive connectors 400 may be exposed from the upper surface of the sealing member 300. One end of the heat transfer plugs 500 may be exposed from the upper surface of the sealing member 300.

The heat transfer plugs 500 may be formed to have a second height H2 and a second diameter D2. The second height H2 of the heat transfer plugs 500 may be within a range of 20 μm to 300 μm. The second diameter D2 of the heat transfer plugs 500 may be within a range of 20 μm to 100 μm.

According to another example embodiment, the plurality of heat transfer plugs 500 may be formed simultaneously with the conductive connectors 400. First, the first and second through openings penetrating the sealing member 300 in the vertical direction may be formed through the etching process. Then, the seed layer may be formed on the first and second through openings, and the first and second through openings may be filled up with the conductive material to form the heat transfer plugs 500 and the conductive connectors 400.

Figure 13:
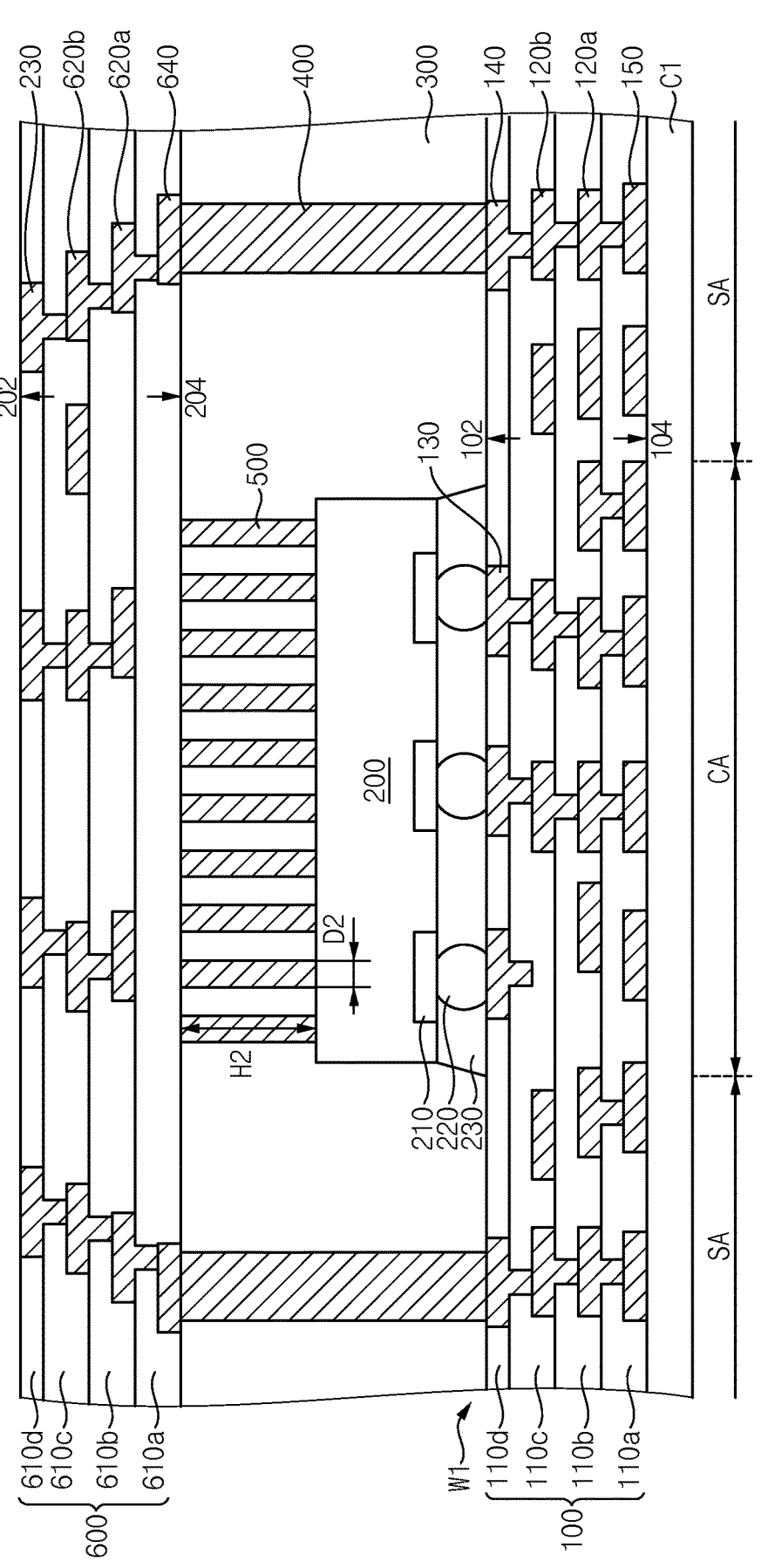

Referring to FIG. 13, processes that are same as or similar to the processes described with reference to FIG. 4 may be performed on the semiconductor wafer W1 to form a second redistribution wiring layer 600.

According to an example embodiment, second connecting pads 640 may be formed on the sealing member 300. The second connecting pads 640 may be respectively formed on upper surfaces of the conductive connectors 400.

Then, after a fifth insulating film 610a is formed on the sealing member 300 to cover the second connecting pad 640, the fifth insulating film 610a may be patterned to form fifth openings that expose the second connecting pads 640. The fifth insulating film 610a may be formed to contact the upper surface of each of the heat transfer plugs 500.

Third redistribution wires 620a may be formed on the fifth insulating film 610a to directly contact the second connecting pads 640 through the fifth openings. After a seed layer is formed on portions of the fifth insulating film 610a and in the fifth openings, the seed layer may be patterned and an electrolytic plating process may be performed to form the third redistribution wires 620a. Accordingly, at least portions of the third redistribution wires 620a may directly contact the second connecting pads 640 through the fifth openings respectively.

Then, after a sixth insulating film 610b is formed on the fifth insulating film 610a to cover the third redistribution wires 620a, the sixth insulating film 610b may be patterned to form sixth openings that expose the third redistribution wires 620a. Fourth redistribution wires 620b may be formed on the sixth insulating film 610b to directly contact the third redistribution wires 220a through the sixth openings respectively.

Then, after a seventh insulating film 610c is formed on the sixth insulating film 610b to cover the fourth redistribution wires 620b, the seventh insulating film 610c may be patterned to form seventh openings that expose the fourth redistribution wires 620b. Third bonding pads 630 may be formed on the seventh insulating film 610c to directly contact the fourth redistribution wires 620b through the seventh openings respectively.

Then, after an eighth insulating film 610d is formed on the seventh insulating film 610c to cover the third bonding pads 630, the eighth insulating layer 610d may be patterned to form eighth openings that expose the third bonding pads 630.

Figure 14:
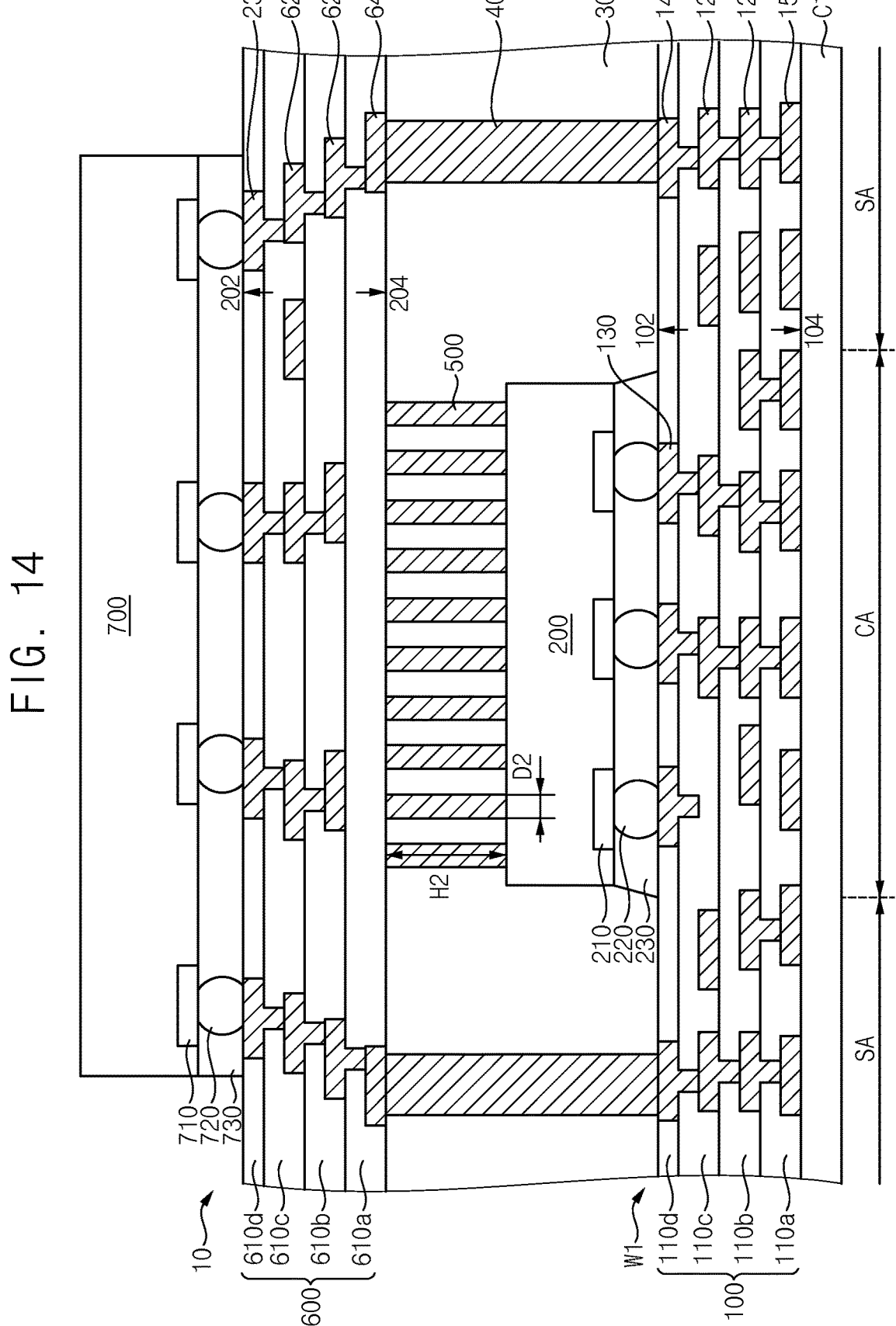

Referring to FIG. 14, according to an example embodiment, processes that are same as or similar to the processes described with reference to FIG. 10 may be performed to mount the second semiconductor device 700 on the second redistribution wiring layer 600, and a second adhesive member 730 that is underfilled between the second redistribution wiring layer 600 and the second semiconductor device 700 may be formed.

In an example embodiment, the second semiconductor device may be mounted on the second redistribution wiring layer 600 by a flip chip bonding method. Second chip pads 710 of the second semiconductor device 700 may be electrically connected to the third bonding pads 630 of the second redistribution wiring layer 600 through the second conductive bumps 720. For example, the second conductive bumps 720 may include micro bumps (uBumps).

Then, a second adhesive member 730 may be filled between the second redistribution wiring layer 600 and the second semiconductor device 700. For example, the second adhesive member 730 may include an epoxy material to reinforce a gap between the second redistribution wiring layer 600 and the second semiconductor device 700.

According to an example embodiment, solder bumps 160 may be formed on the plurality of first connecting pads 150 of the first redistribution wiring layer 100, the second semiconductor device 700 may be mounted on the second redistribution wiring layer 600, and the semiconductor wafer W1 may be cut to from the semiconductor package 10. According to an example embodiment, the solder bumps 160 may be formed after the process of mounting the second semiconductor device 700. However, the disclosure is not limited thereto, and as such, according to another example embodiment, the solder bumps 160 may be formed before the process of mounting the second semiconductor device 700.

The solder bumps 160 may be formed on the first plurality of connecting pads 150. According to an example embodiment, after a third temporary opening of a third photoresist pattern is filled with a conductive material, the third photoresist pattern may be removed and a reflow process may be performed to form a solder bump 160. For example, the conductive material may be formed by a plating process. Alternatively, the solder bumps 160 may be formed by a screen printing method, a deposition method, or the like. For example, the solder bumps 160 may include C4 bumps.

Then, the semiconductor wafer W1 may be cut to complete the semiconductor package 10 of FIG. 1. The semiconductor wafer W1 may be cut along a scribe lane region. The semiconductor wafer W1 may be cut through a dicing process.

As described above, the heat transfer plugs 500 formed of the conductive materials may receive heat from the first semiconductor device 200 mounted in the chip mounting region CA. Since the heat transfer plugs 500 extend from the upper surface of the sealing member 300, the heat may be transferred to the upper surface of the sealing member 300. Since the heat transfer plugs 500 have the uneven structure, the convection phenomenon may be increased inside the semiconductor package 10. Due to the convection phenomenon, the heat transfer plugs 500 may quickly dissipate the heat to an outside of the semiconductor package 10.

Also, in the manufacturing method of the semiconductor package 10, the through openings may be formed using the same process as a process of forming a through silicon via (TSV). The manufacturing method of the semiconductor package 10 may not use a front end of line (FEOL) process or a back end of line (BEOL) process. The manufacturing method of the semiconductor package 10 may reduce process difficulty and cost by simplifying the process.

Figure 15:
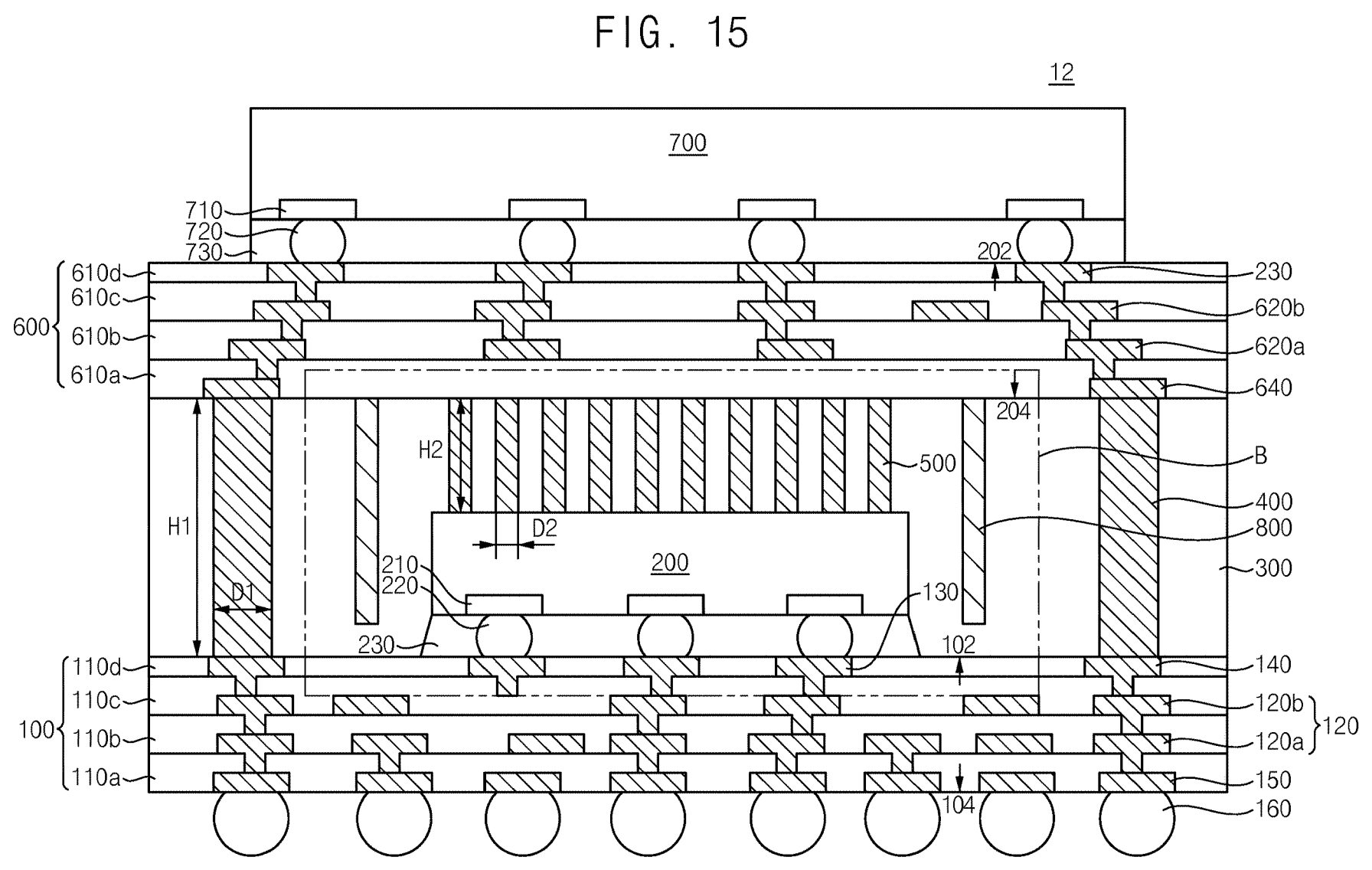
Figure 16:
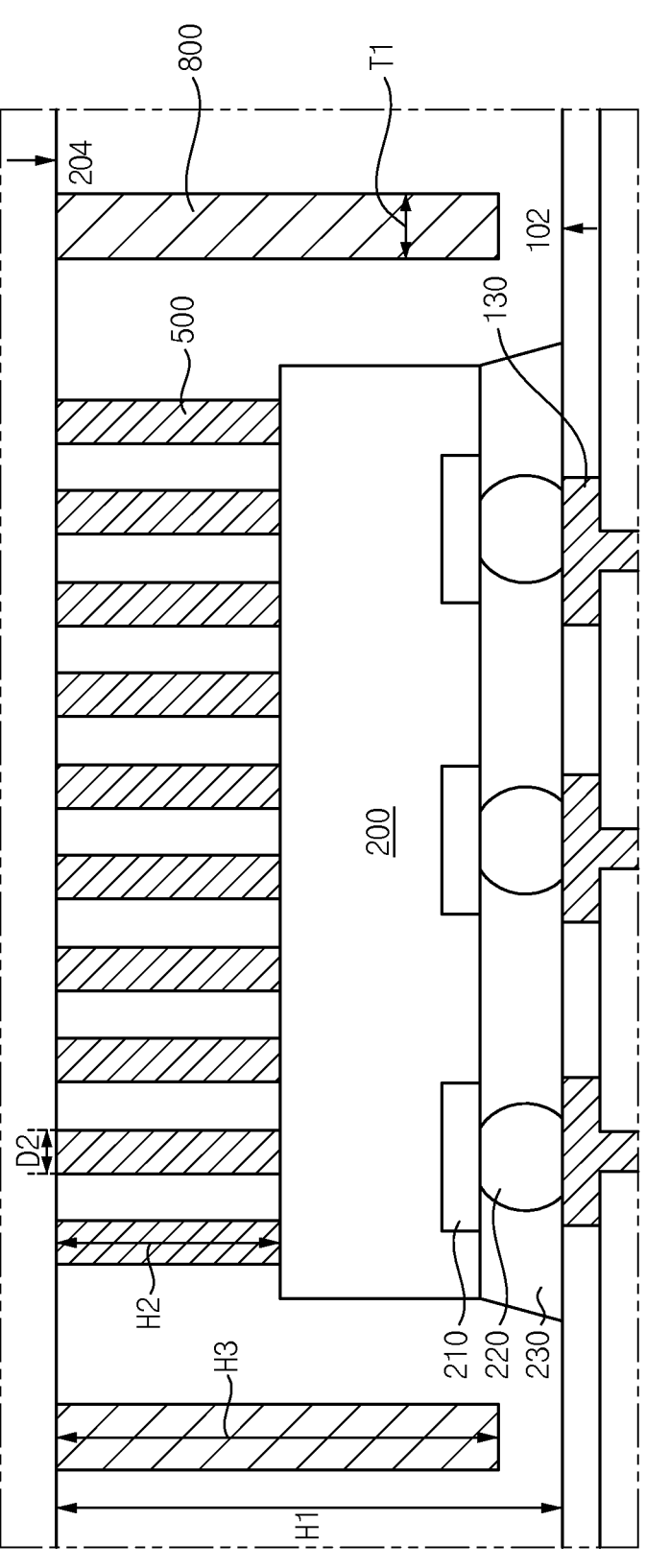
Figure 17:
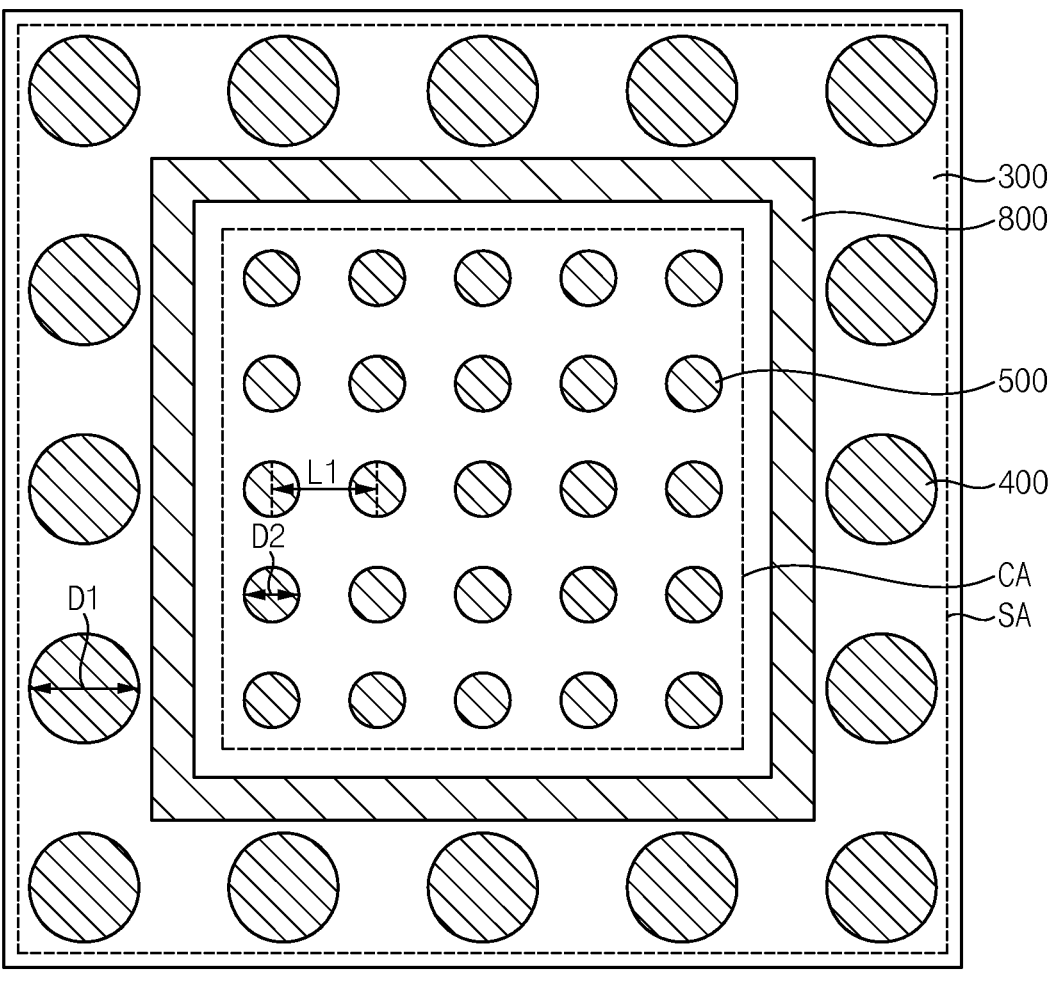
Figure 18:
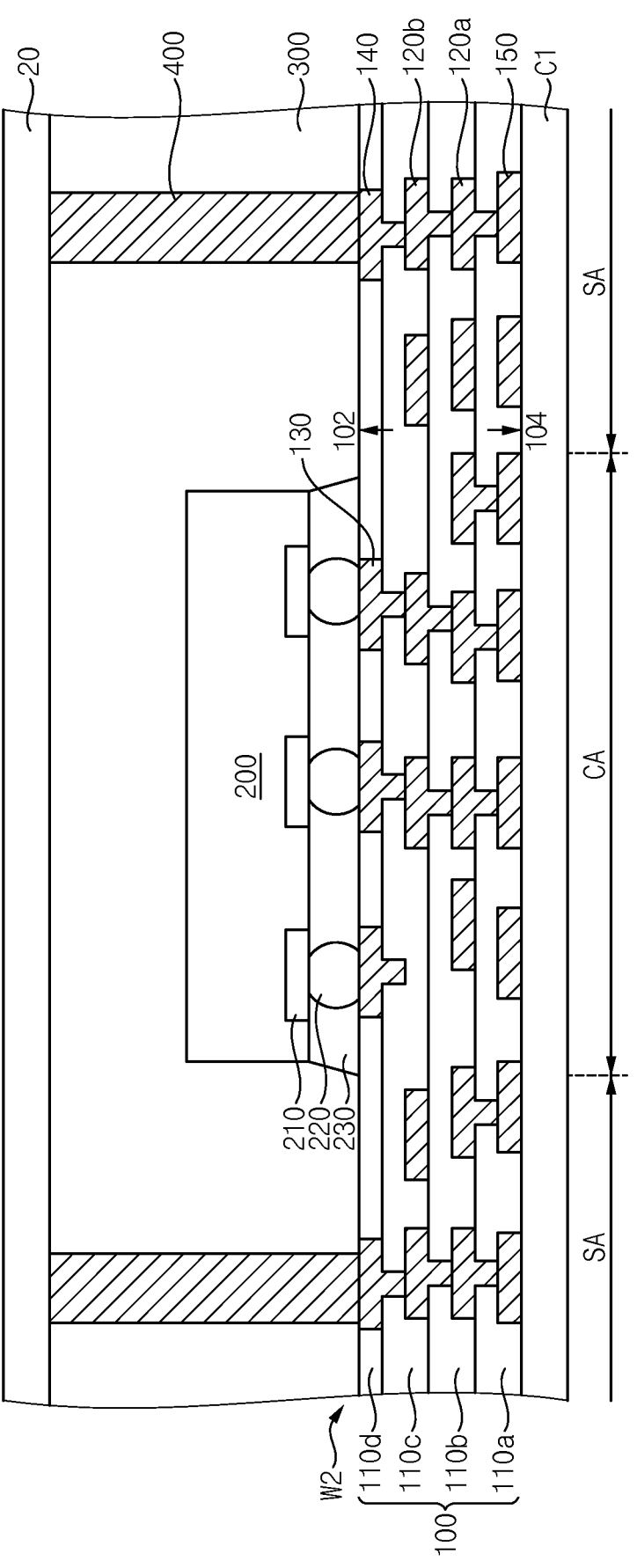
Figure 19:
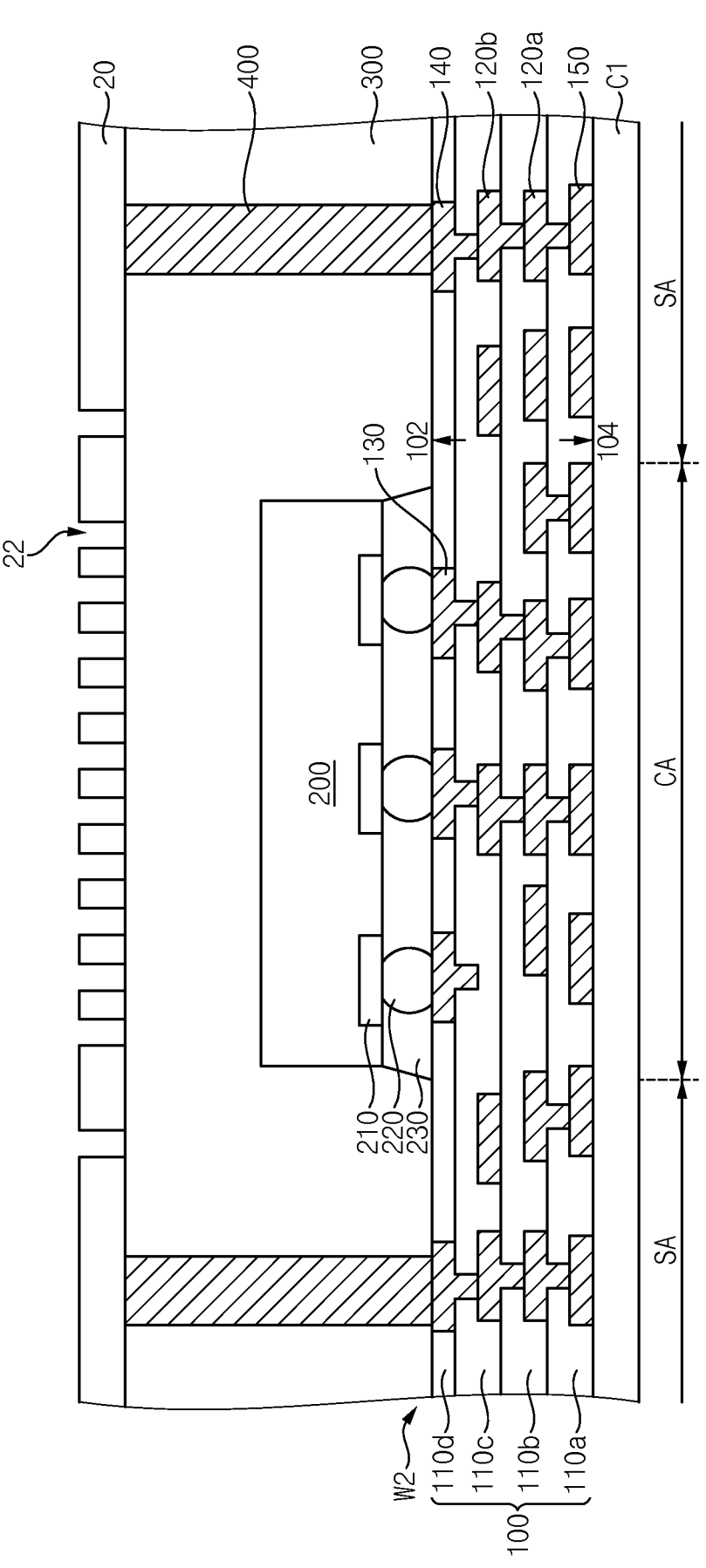
Figure 20:
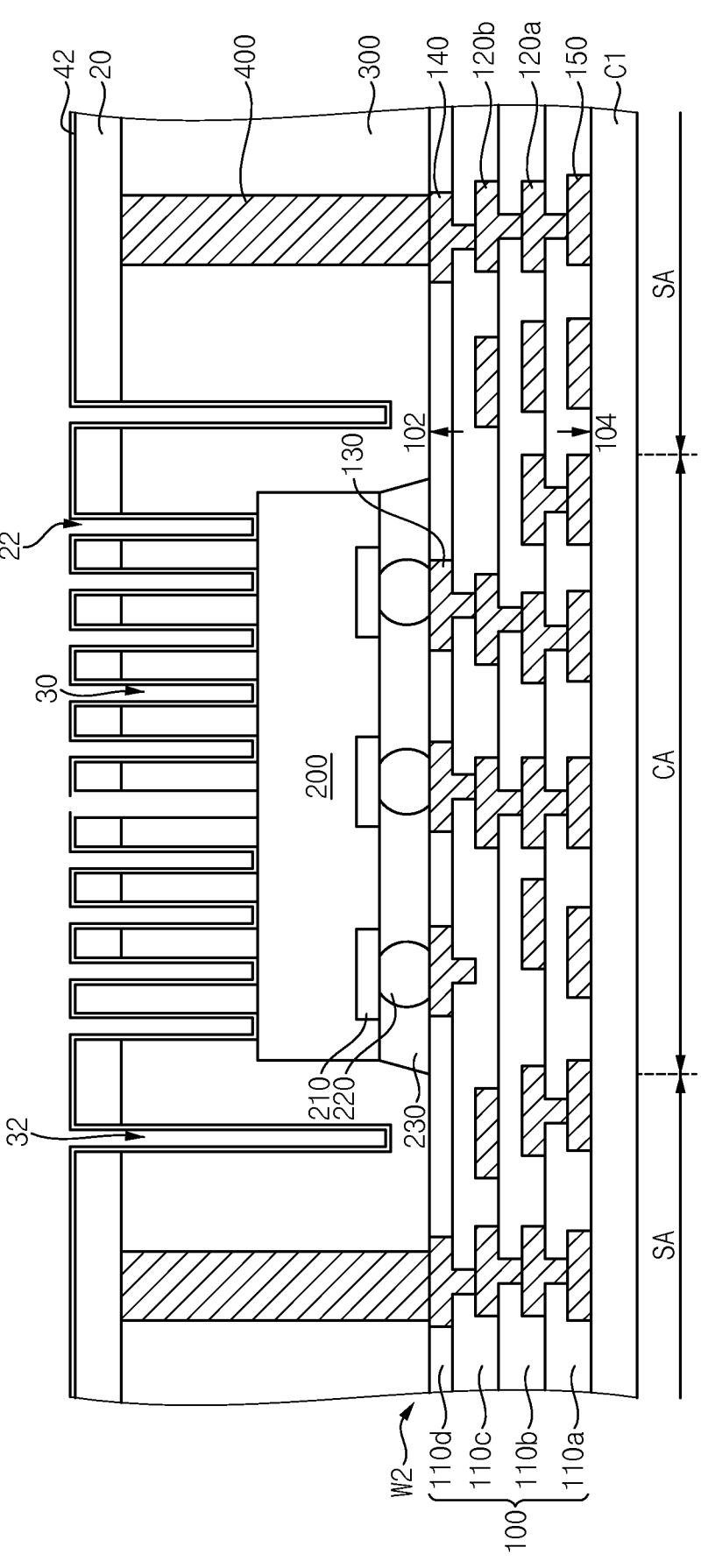
Figure 21:
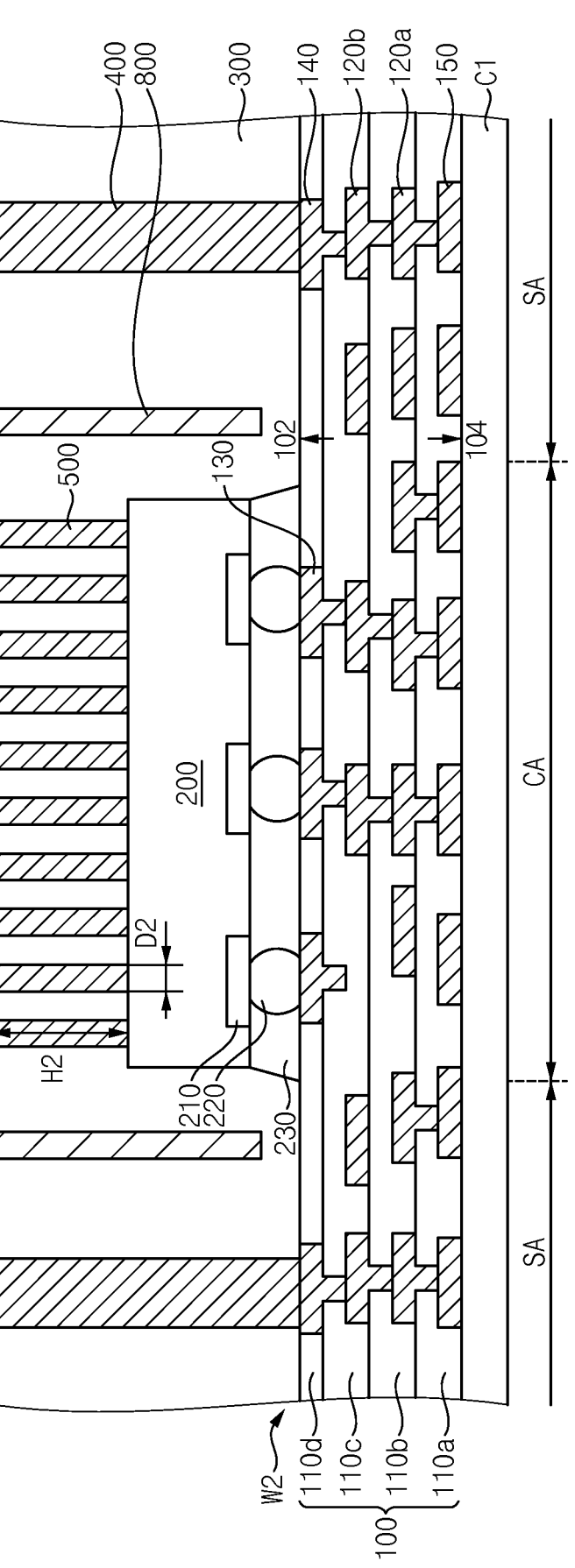
Figure 22:
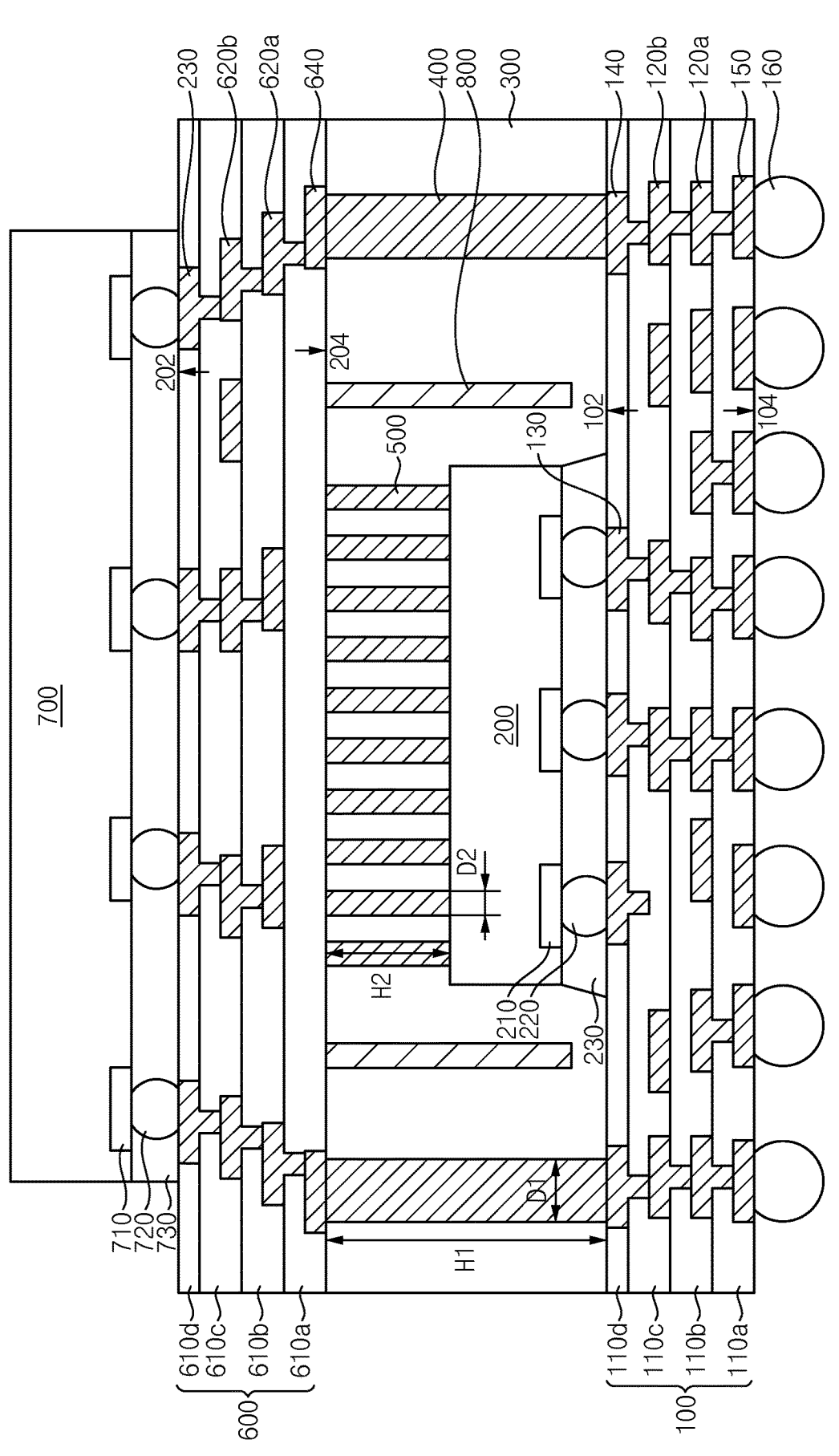

FIG. 15 is a plan view illustrating a semiconductor package having a heat transfer plate in accordance with an example embodiment. FIG. 16 is an enlarged cross-sectional view illustrating portion 'B' in FIG. 15. FIG. 17 is a plan view illustrating an upper surface of a sealing member in FIG. 15. The semiconductor package may be substantially the same as or similar to the semiconductor package described with reference to FIGS. 1 to 3 except for a configuration of a heat transfer plate. Thus, same or similar components are denoted by the same or similar reference numerals, and repeated descriptions of the same components will be omitted.

Referring to FIGS. 15 to 17, a semiconductor package 12 may include the first redistribution wiring layer 100, the first semiconductor device 200 arranged on the first redistribution wiring layer 100, the sealing member 300 provided on the first redistribution wiring layer 100 and covering the first semiconductor device 200, the conductive connectors 400 penetrating the sealing member 300 and electrically connected to the first redistribution wiring layer 100, the plurality of heat transfer plugs 500 penetrating the sealing member 300, and a heat transfer plate 800 enclosing the first semiconductor device 200 and penetrating the sealing member 300. The semiconductor package 12 may further include the second redistribution wiring layer 600 arranged on the sealing member 300, and the second semiconductor device 700 arranged on the second redistribution wiring layer 600.

In an example embodiment, the heat transfer plate 800 may penetrate through the sealing member 300 in the vertical direction. When viewed from a plan view, the heat transfer plate 800 may have a ring shape with a preset gap. The ring shape may include a rectangular ring shape, a circular ring shape, and the like.

The heat transfer plate 800 may be provided in the peripheral region SA surrounding the chip mounting region CA where the first semiconductor device 200 is mounted. The heat transfer plate 800 may be provided and spaced apart from the first semiconductor device 200. The heat transfer plate 800 may absorb the heat emitted from the first semiconductor device 200, and the heat transfer plate 800 may block the heat flowing from the outside into the first semiconductor device 200. The heat transfer plate 800 may transfer heat generated from the first semiconductor device 200 to the upper surface of the sealing member 300.

The heat transfer plate 800 may have a third height H3 from the upper surface of the sealing member 300. The third height H3 of the heat transfer plate 800 may be equal to or smaller than the first height H1 of the conductive connectors 400. For example, the third height H3 may be within a range of 100 μm to 400 μm.

The heat transfer plate 800 may have a first thickness Ti. As the first thickness T1 of the heat transfer plate 800 increases, the heat transfer plate 800 may transfer more of the heat from the first semiconductor device 200 to the upper surface of the sealing member 300. For example, the first thickness T1 may be within a range of 20 μm to 100 μm.

For example, the heat transfer plate 800 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn).

Hereinafter, a method of manufacturing the semiconductor package in FIG. 15 will be described.

FIGS. 18 to 22 are cross-sectional views illustrating a method of manufacturing the semiconductor package in FIG. 15 in accordance with an example embodiment.

Referring to FIGS. 18 to 22, processes that are same as or similar to the processes described with reference to FIGS. 8 to 12 may be performed to form a plurality of heat transfer plugs 500 and a heat transfer plate 800.

First, a first semiconductor device 200 may be mounted on a first redistribution wiring layer 100 of a second semiconductor wafer W2, a sealing member 300 may be formed to cover the first semiconductor device 200, conductive connectors 400 may be formed to penetrate the sealing member 300 in a vertical direction. The first semiconductor device 200 may be mounted in the chip mounting region CA, the conductive connectors 400 may be formed in the peripheral region SA.

Then, an upper surface of the sealing member 300 may be covered through a second photoresist layer 20. Then, an exposure process may be performed on the second photoresist layer 20 to form a second photoresist pattern 22 that exposes regions of the heat transfer plugs 500 and the heat transfer plate 800.

Then, an etching process may be performed on the second photoresist pattern 22 to form second through openings 30 and a trench 32. For example, the etching process may include a wet etching process, a dry etching process, a plasma etching process, and the like.

Then, a seed layer 42 may be formed on the second through openings 30 and the trench 32. The seed layer 42 may form the heat transfer plugs 500 in the second through openings 30. The seed layer 42 may form a heat transfer plate 800 in the trench 32. For example, the seed layer 42 may include titanium (Ti), titanium nitrogen compound (TiN), titanium oxygen compound (TiO$_2$), chromium nitrogen compound (CrN), titanium carbon nitrogen compound (TiCN), titanium aluminum nitrogen compound (TiAlN) or alloys thereof. The seed layer 42 may be formed by a sputtering process.

The heat transfer plugs 500 may be formed on the second through openings 30 that penetrate the second photoresist layer 20 in the vertical direction. A conductive material may be introduced into the second through openings 30 to form the heat transfer plugs 500. The conductive material may be hardened in the second through openings 30 to form the heat transfer plugs 500. The heat transfer plugs 500 may be formed on the chip mounting region CA of the first redistribution wiring layer 100.

The heat transfer plate 800 may be formed on the trench 32 that penetrates the second photoresist layer 20 in the vertical direction. The conductive material may be introduced into the trench 32 to form the heat transfer plate 800. The conductive material may be hardened in the trench 32 to form the heat transfer plugs 500. The heat transfer plate 800 may be formed on the peripheral region SA of the first redistribution wiring layer 100. A second plating process may be performed on the trench 32 to form the heat transfer plate 800. For example, the heat transfer plate 800 may be formed by a plating process, an electroless plating process, a vapor deposition process, or the like.

Then, the second photoresist layer 20 may be removed to form the heat transfer plugs 500 and the heat transfer plates 800 that extend from the upper surface of the sealing member 300 respectively. The heat transfer plate 800 may be formed to surround and be spaced apart from the first semiconductor device 200. One end of the heat transfer plate 800 may be exposed from the upper surface of the sealing member 300.

Then, processes that are same as to or similar to the processes described with reference to FIG. 13 are performed on a second semiconductor wafer W2 to form a second redistribution wiring layer 600 that has the sealing member 300, the heat transfer plugs 500, the heat transfer plates 800, and the conductive connectors 400.

Then, processes that are same as to or similar to the processes described with reference to FIG. 14 may be performed to mount the second semiconductor device 700 on the second redistribution wiring layer 600.

Then, the semiconductor package 12 in FIG. 15 may be completed by cutting the second semiconductor wafer W2. The second semiconductor wafer W2 may be cut along a scribe lane region. The second semiconductor wafer W2 may be cut through a dicing process.

The foregoing is illustrative of various example embodiments of the disclosure and is not to be construed as limiting of the disclosure. Although a few example embodiments have been described, those skilled in the art will readily appreciate that many modifications are possible with the example embodiments without materially departing from the novel teachings and advantages of the present invention. Accordingly, all such modifications are intended to be included within the scope of the disclosure as defined in the claims.

What is claimed is:

1. A method of manufacturing a semiconductor package, comprising:

forming a first redistribution wiring layer including a chip mounting region and a peripheral region surrounding the chip mounting region, the first redistribution wiring layer having a plurality of first redistribution wires stacked in at least two layers;

mounting a first semiconductor device on the chip mounting region of the first redistribution wiring layer;

forming a sealing member on the first redistribution wiring layer, the sealing member provided on an upper surface and a side surface of the first semiconductor device;

forming a plurality of conductive connectors on the peripheral region of the first redistribution wiring layer, the plurality of conductive connectors penetrating the sealing member and electrically connected to the plurality of first redistribution wires;

forming a plurality of through openings extending from an upper surface of the sealing member towards an upper surface of the first semiconductor device to expose the upper surface of the first semiconductor device; and forming a plurality of heat transfer plugs by filling the through openings with a conductive material.

2. The method of claim 1, further comprising:

forming a second redistribution wiring layer on the sealing member, the second redistribution wiring layer having a plurality of second redistribution wires electrically connected to the plurality of conductive connectors on the sealing member; and mounting a second semiconductor device electrically connected to the plurality of second redistribution wires on the second redistribution wiring layer.

3. The method of claim 1, further comprising:

grinding the upper surface of the sealing member such that upper surfaces of the plurality of conductive connectors and upper surfaces of the plurality of heat transfer plugs are exposed.

4. The method of claim 1, further comprising:

forming a trench extending in the sealing member to surround the first semiconductor device on the peripheral region, the trench having a first depth from the upper surface of the sealing member; and forming a heat transfer plate by filling up the trench with the conductive material.

5. The method of claim 4, wherein the one or more of the plurality of conductive connectors has a first height from an upper surface of the first redistribution wiring layer to an upper surface of the sealing member, wherein the heat transfer plate has a first depth from the upper surface of the sealing member, and wherein the first height is greater than the first depth.

6. The method of claim 1, wherein a distance between a first heat plug and a second heat plug, among the plurality of heat transfer plugs, is in a range of 50 μm to 500 μm.

7. The method of claim 1, wherein a height of one or more of the plurality of heat transfer plugs is in a range of 20 μm to 300 μm.

8. The method of claim 1, wherein a diameter of one or more of the plurality of heat transfer plugs is within a range of 20 μm to 100 μm.

9. The method of claim 1, wherein the plurality of heat transfer plugs comprises at least one of nickel (Ni), antimony (Sb), bismuth (Bi), zinc (Zn), indium (In), palladium (Pd), platinum (Pt), aluminum (Al), copper (Cu), Molybdenum (Mo), titanium (Ti), gold (Au), silver (Ag), chromium (Cr), or tin (Sn).

10. The method of claim 1, wherein the sealing member comprises at least one of epoxy resin, UV resin, polyurethane resin, silicone resin or silica filler.

11. A method of manufacturing a semiconductor package, comprising:

forming a first redistribution wiring layer having a chip mounting region and a peripheral region surrounding the chip mounting region;

forming a sealing member on the first redistribution wiring layer, the sealing member provided on an upper surface and a side surface of a first semiconductor device mounted on the chip mounting region of the first redistribution wiring layer;

forming a plurality of conductive connectors on the peripheral region of the first redistribution wiring layer, the plurality of conductive connectors penetrating the sealing member and electrically connected to a plurality of plurality of first redistribution wires of the first redistribution wiring layer;

forming a plurality of through openings extending from an upper surface of the sealing member towards an upper surface of the first semiconductor device to expose the upper surface of the first semiconductor device;

forming a trench in the sealing member to extend from the upper surface of the sealing member in the peripheral region, the trench surrounding the first semiconductor device to be spaced apart from the first semiconductor device; and forming a plurality of heat transfer plugs and a heat transfer by filling up the through openings and the trench with a conductive material.

12. The method of claim 11, further comprising:

forming a second redistribution wiring layer on the sealing member, the second redistribution wiring layer having a plurality of second redistribution wires electrically connected to the plurality of conductive connectors on the sealing member; and mounting a second semiconductor device electrically connected to the plurality of second redistribution wires on the second redistribution wiring layer.

13. The method of claim 11, further comprising:

grinding the upper surface of the sealing member until upper surfaces of the plurality of conductive connectors, the plurality of heat transfer plugs and the heat transfer plate are exposed.

14. The method of claim 11, wherein the one or more of the plurality of conductive connectors has a first height from an upper surface of the first redistribution wiring layer to an upper surface of the sealing member, wherein the heat transfer plate has a first depth from the upper surface of the sealing member, and wherein the first height is greater than the first depth.

15. The method of claim 11, wherein a distance between a first heat transfer plug and a second heat transfer plug, among the plurality of heat transfer plugs, is in a range of 50 μm to 500 μm.

16. The method of claim 11, wherein a height of one or more of the plurality of heat transfer plugs is in a range of 20 μm to 300 μm.

17. The method of claim 11, wherein a diameter of one or more the plurality of heat transfer plugs is within a range of 20 μm to 100 μm.

18. The method of claim 11, wherein the plurality of heat transfer plugs comprises at least one of nickel (Ni), antimony (Sb), bismuth (Bi), zinc (Zn), indium (In), palladium (Pd), platinum (Pt), aluminum (Al), copper (Cu), Molybdenum (Mo), titanium (Ti), gold (Au), silver (Ag), chromium (Cr), or tin (Sn).

19. The method of claim 11, wherein the sealing member comprises at least one of epoxy resin, UV resin, polyurethane resin, silicone resin or silica filler.

* * * * *